US008871108B2

(12) United States Patent
Lauerhaas

(10) Patent No.: US 8,871,108 B2
(45) Date of Patent: Oct. 28, 2014

(54) PROCESS FOR REMOVING CARBON MATERIAL FROM SUBSTRATES

(71) Applicant: TEL FSI, Inc., Chaska, MN (US)

(72) Inventor: Jeffrey M. Lauerhaas, Waconia, MN (US)

(73) Assignee: TEL FSI, Inc., Chaska, MN (US)

( * ) Notice: Subject to any disclaimer, the term of this patent is extended or adjusted under 35 U.S.C. 154(b) by 40 days.

(21) Appl. No.: 13/836,098

(22) Filed: Mar. 15, 2013

(65) Prior Publication Data

US 2014/0206195 A1  Jul. 24, 2014

Related U.S. Application Data

(60) Provisional application No. 61/755,434, filed on Jan. 22, 2013.

(51) Int. Cl.
| | |
|---|---|
| *C23F 1/00* | (2006.01) |
| *B44C 1/22* | (2006.01) |
| *H01L 21/302* | (2006.01) |
| *H01L 21/02* | (2006.01) |

(52) U.S. Cl.
CPC ............................ H01L 21/02101 (2013.01)
USPC ................. 216/81; 216/83; 216/96; 438/745; 134/2; 134/30; 134/39

(58) Field of Classification Search
USPC .......................... 216/81, 83, 96; 134/2, 30, 39
See application file for complete search history.

(56) References Cited

U.S. PATENT DOCUMENTS

| | | |
|---|---|---|
| 4,001,383 A | 1/1977 | Petersen |
| 4,778,536 A | 10/1988 | Grebinski |
| 5,037,506 A | 8/1991 | Gupta et al. |
| 5,203,956 A | 4/1993 | Hansen |
| 5,785,875 A | 7/1998 | Hawthorne et al. |
| 5,845,846 A | 12/1998 | Watanabe et al. |
| 5,858,106 A | 1/1999 | Ohmi et al. |
| 5,861,064 A | 1/1999 | Oikari et al. |

(Continued)

FOREIGN PATENT DOCUMENTS

| | | |
|---|---|---|
| CA | 2332096 | 7/2001 |
| CN | 1320485 | 11/2001 |

(Continued)

OTHER PUBLICATIONS

Tsvetanova, D. et al., "Characterization of 248nm Deep Ultraviolet (DUV) Photoresist after Ion Implantation", ECS Transactions, 25(5): (2009), pp. 187-194.

(Continued)

*Primary Examiner* — Shamim Ahmed
(74) *Attorney, Agent, or Firm* — Kagan Binder, PLLC

(57) ABSTRACT

A method of removing carbon materials, preferably amorphous carbon, from a substrate includes dispensing a liquid sulfuric acid composition including sulfuric acid and/or its desiccating species and precursors and having a water/sulfuric acid molar ratio of no greater than 5:1 onto an material coated substrate in an amount effective to substantially uniformly coat the carbon material coated substrate. The liquid sulfuric acid composition is exposed to water vapor in an amount effective to increase the temperature of the liquid sulfuric acid composition above the temperature of the liquid sulfuric acid composition prior to exposure to the water vapor. In preferred embodiments, amorphous carbon is selectively removed as compared to a silicon oxide (e.g., silicon dioxide) and/or silicon nitride.

29 Claims, 11 Drawing Sheets

(56) References Cited

U.S. PATENT DOCUMENTS

| | | | |
|---|---|---|---|
| 5,971,368 A | 10/1999 | Nelson et al. | |
| 5,998,305 A | 12/1999 | Holmer et al. | |
| 6,032,682 A | 3/2000 | Verhaverbeke | |
| 6,146,469 A | 11/2000 | Toshima | |
| 6,231,775 B1 | 5/2001 | Levenson et al. | |
| 6,235,641 B1 | 5/2001 | Christenson | |
| 6,242,368 B1 | 6/2001 | Holmer et al. | |
| 6,267,301 B1 | 7/2001 | Haruch | |
| 6,274,506 B1 | 8/2001 | Christenson et al. | |
| 6,332,724 B1 | 12/2001 | Yano et al. | |
| 6,354,922 B1 | 3/2002 | Sakurai et al. | |
| 6,403,544 B1 | 6/2002 | Davenhall et al. | |
| 6,406,551 B1 | 6/2002 | Nelson et al. | |
| 6,451,118 B1 | 9/2002 | Garriga | |
| 6,488,272 B1 | 12/2002 | Nguyen | |
| 6,584,989 B2 | 7/2003 | Taft et al. | |
| 6,598,805 B2 | 7/2003 | Sakai et al. | |
| 6,599,438 B2 | 7/2003 | Levenson et al. | |
| 6,610,168 B1 | 8/2003 | Miki et al. | |
| 6,616,773 B1 | 9/2003 | Kuzumoto et al. | |
| 6,648,307 B2 | 11/2003 | Nelson et al. | |
| 6,689,284 B1 | 2/2004 | Nakasaki | |
| 6,696,228 B2 * | 2/2004 | Muraoka et al. | 430/329 |
| 6,770,424 B2 | 8/2004 | Mandal et al. | |
| 6,817,370 B2 | 11/2004 | Bergman et al. | |
| 6,837,252 B2 | 1/2005 | Bergman | |
| 6,848,455 B1 | 2/2005 | Shrinivasan et al. | |
| 6,849,192 B2 | 2/2005 | Nakasaki | |
| 6,867,148 B2 | 3/2005 | Yates et al. | |
| 6,869,487 B1 | 3/2005 | Bergman | |
| 6,908,565 B2 | 6/2005 | Kim et al. | |
| 7,163,588 B2 | 1/2007 | Bergman | |
| 7,305,999 B2 | 12/2007 | Henke et al. | |
| 7,422,031 B2 | 9/2008 | Benson et al. | |
| 7,592,264 B2 * | 9/2009 | Christenson et al. | 438/735 |
| 7,682,643 B2 | 3/2010 | Sasame et al. | |
| 7,807,574 B2 * | 10/2010 | Yu et al. | 438/689 |
| 7,819,984 B2 | 10/2010 | DeKraker et al. | |
| 7,972,653 B2 | 7/2011 | Tachikawa et al. | |
| 8,142,571 B2 | 3/2012 | Christenson et al. | |
| 8,235,062 B2 | 8/2012 | Lauerhaas et al. | |
| 8,343,713 B2 | 1/2013 | Huang et al. | |
| 8,387,635 B2 | 3/2013 | Collins et al. | |
| 8,394,228 B2 | 3/2013 | Christenson et al. | |
| 8,394,455 B2 | 3/2013 | Hirakuri et al. | |
| 8,544,483 B2 | 10/2013 | Collins et al. | |
| 2002/0063169 A1 | 5/2002 | Verhaverbeke et al. | |
| 2002/0088478 A1 * | 7/2002 | Degendt et al. | 134/3 |
| 2002/0112744 A1 | 8/2002 | Besseling | |
| 2002/0157686 A1 | 10/2002 | Kenny et al. | |
| 2002/0170573 A1 | 11/2002 | Christenson et al. | |
| 2003/0041881 A1 | 3/2003 | Isago et al. | |
| 2003/0190870 A1 | 10/2003 | Shih et al. | |
| 2004/0206452 A1 | 10/2004 | Okuda et al. | |
| 2005/0011537 A1 | 1/2005 | Toshima et al. | |
| 2005/0139240 A1 | 6/2005 | Bong et al. | |
| 2005/0200123 A1 | 9/2005 | Benson et al. | |
| 2005/0205115 A1 | 9/2005 | Okuyama et al. | |
| 2006/0156927 A1 | 7/2006 | Udagawa et al. | |
| 2006/0263729 A1 * | 11/2006 | Shea et al. | 430/311 |
| 2007/0161248 A1 | 7/2007 | Christenson et al. | |
| 2007/0227556 A1 | 10/2007 | Bergman | |
| 2007/0243700 A1 | 10/2007 | Qin et al. | |
| 2007/0245954 A1 | 10/2007 | Collins et al. | |
| 2007/0264841 A1 * | 11/2007 | Chebi et al. | 438/770 |
| 2008/0008834 A1 | 1/2008 | Collins et al. | |
| 2008/0283090 A1 | 11/2008 | DeKraker et al. | |
| 2010/0018951 A1 | 1/2010 | Christenson et al. | |
| 2010/0124410 A1 | 5/2010 | Benson | |
| 2010/0326477 A1 | 12/2010 | DeKraker et al. | |
| 2012/0145672 A1 | 6/2012 | Ratkovich et al. | |
| 2013/0115782 A1 | 5/2013 | Christenson et al. | |
| 2013/0323920 A1 * | 12/2013 | Chang et al. | 438/586 |

FOREIGN PATENT DOCUMENTS

| | | |
|---|---|---|
| JP | 03-038628 | 4/1991 |
| JP | 04-004060 | 1/1992 |
| JP | 07-335606 | 12/1995 |
| JP | 2001-118820 | 4/2001 |
| JP | 2001-237211 | 8/2001 |
| JP | 2002-231683 | 8/2002 |
| JP | 2003-017455 | 1/2003 |
| JP | 2003/071332 | 3/2003 |
| JP | 2004-351321 | 12/2004 |
| JP | 2005-142290 | 6/2005 |
| JP | 2005-243814 | 9/2005 |
| JP | 2007-201070 | 8/2007 |
| KR | 10-2004-0035721 | 4/2004 |
| SU | 865975 | 9/1981 |
| WO | 99-52654 | 10/1999 |
| WO | 03/015146 | 2/2003 |
| WO | WO 2008/143909 | 11/2008 |
| WO | WO 2011/084334 | 7/2011 |

OTHER PUBLICATIONS

Valensi, et al, "SULPHUR ($^1$) Equilibrium Diagram and its Interpretation," Atlas of Electrochemical Equilibria in Aqueous Solutions, Section 19.2, (1974), pp. 551-553.

Verhaverbeke, et al, "Organic Contamination Removal," Contamination-Free Manufacturing for Semiconductors and Other Precision Products, Chapter 9, (2001), pp. 317-331.

Wei, et al, "Alternative Methods for Resist Stripping," Electrochemical Society Proceedings vol. 97-35, (1998), pp. 496-504.

* cited by examiner

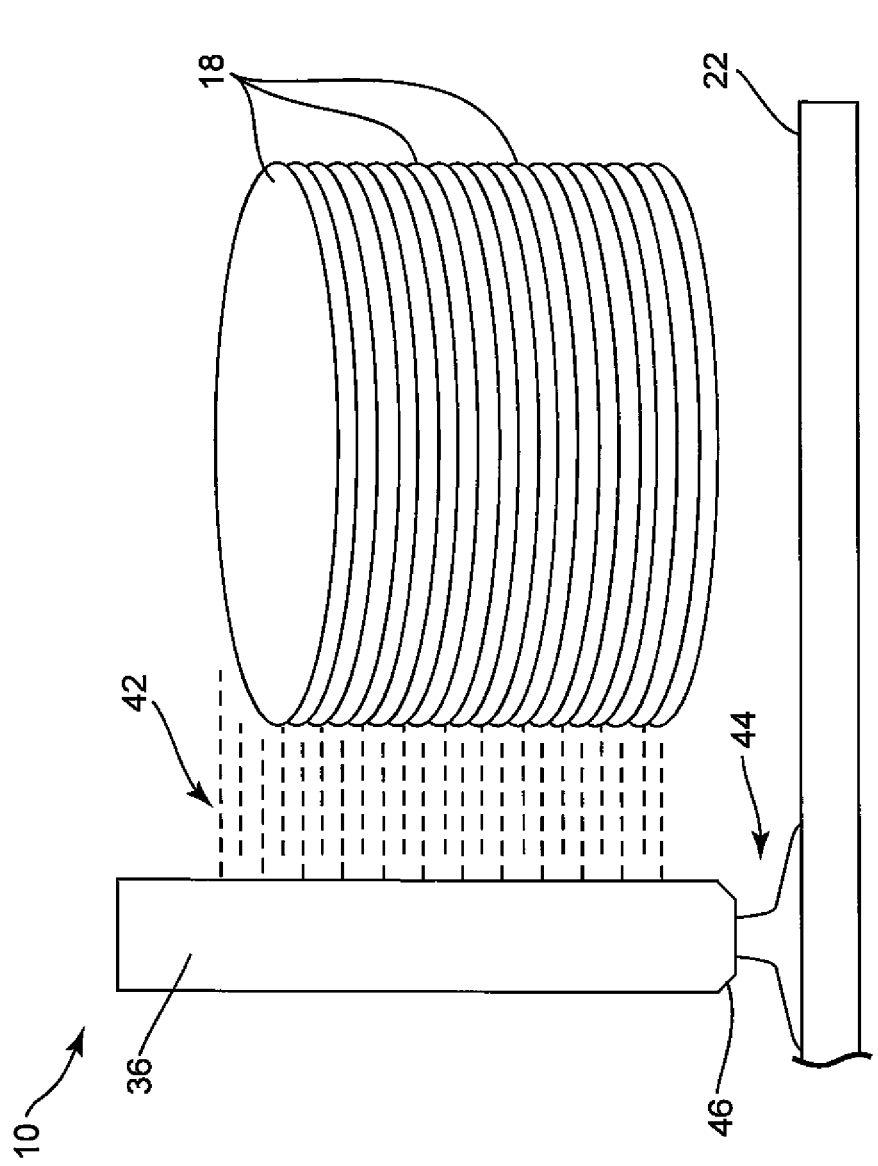

US 8,871,108 B2

PROCESS FOR REMOVING CARBON MATERIAL FROM SUBSTRATES

This application claims the benefit of U.S. Provisional Application Ser. No. 61/755,434, filed Jan. 22, 2013, entitled "PROCESS FOR REMOVING CARBON FILMS FROM SUBSTRATES" which application is incorporated herein by reference in its entirety.

FIELD OF THE INVENTION

The present invention relates to methods for removing material from substrates. More specifically, the present invention relates to removal of materials, and preferably carbon materials, from substrates using sulfuric acid and water vapor.

BACKGROUND

Advances in electronic technology cause integrated circuits to be formed on substrates such as silicon wafers with ever increasing packing density of active components. The formation of circuits is carried out by sequential application, processing, and selective removal of various components from the substrate. Various compositions have been developed for removal of specific classes of components from substrates in semiconductor wafer technologies. For example, a composition commonly denoted SC-1, which contains a mixture of $NH_4OH$(29 wt %)/$H_2O_2$(30 wt %)/water at a volume ratio of about 1:1:5 (or at somewhat higher dilution ratios), is typically used to remove particles and to reoxidize hydrophobic silicon surfaces. Similarly, a composition commonly denoted SC-2, which contains a mixture of HCl(37 wt %)/$H_2O_2$(30 wt %)/water at a volume ratio of about 1:1:5 (or at somewhat higher dilution ratios), is typically used to remove metals. An additional composition, commonly called SPM or a Piranha composition, comprises $H_2SO_4$(98 wt %)/$H_2O_2$(30 wt %) at a volume ratio of about 2:1 to 20:1, and is typically used to remove organic contamination or some metal layers.

U.S. Pat. No. 7,592,264 describes a method of removing materials, preferably photoresist, from a substrate. The method includes dispensing a liquid sulfuric acid composition comprising sulfuric acid and/or its desiccating species and precursors. The entire contents of this patent is hereby incorporated by reference. Removing photoresist is also disclosed in WO 2008/143909, the entirety of which is incorporated herein by reference.

In addition to photoresist, there are other well known materials such as carbon materials (e.g., amorphous carbon, diamond-like carbon, and/or graphitic carbon) that can be used in many circuit manufacturing processes. For example, such materials may be used to assist in formation of sequential layers. In stages of the manufacturing process, at least a portion of some of these materials are often removed, preferably without substantial damage to the substrate, including structures formed thereon. It is noted that carbon materials such as amorphous carbon, diamond-like carbon, and/or graphitic carbon materials are distinct from photoresist material. For example, the article "Characterization of 248 nm Deep Ultraviolet (DUV) Photoresist after ion Implantation" reports that while photoresist was detected (e.g., in FIG. 4), no experimental evidence was found for the presence of amorphous carbon.

It would be desirable to identify alternative techniques and compositions for treatment to remove at least a portion, preferably all, of carbon materials, especially amorphous carbon materials from substrates such as semiconductor wafers.

SUMMARY OF THE INVENTION

It has surprisingly been found that sulfuric acid and desiccating sulfuric acid species and precursors can be effective in removing carbon materials and most especially amorphous carbon from the surface of substrates when a liquid sulfuric acid composition having a water/sulfuric acid molar ratio of no greater than about 5:1 is exposed to water vapor in an amount effective to increase the temperature of the liquid sulfuric acid composition above the temperature of the liquid sulfuric acid composition prior to exposure to the water vapor. In an embodiment of the present invention, the liquid sulfuric acid composition is exposed to water vapor in an amount effective to increase the temperature of the liquid sulfuric acid composition above both (i) the temperature of the liquid sulfuric acid composition prior to exposure to the water vapor and (ii) the temperature of the water vapor. In a preferred embodiment, a liquid sulfuric acid composition having a water/sulfuric acid molar ratio of no greater than about 5:1 is exposed to water vapor in an amount effective to increase the temperature of the liquid sulfuric acid composition on the substrate surface above both (i) the on-substrate temperature of the liquid sulfuric acid composition prior to exposure to the water vapor and (ii) the temperature of the water vapor. The present method is particularly significant in the case of selective removal of amorphous carbon materials as compared to silicon oxides and/or silicon nitride, even in the case when the amorphous carbon has been doped, under certain process conditions.

For purposes of brevity, liquid sulfuric acid compositions as discussed herein will be understood to comprise sulfuric acid and/or its desiccating sulfuric acid species and precursors, and discussions regarding sulfuric acid contained in these liquid compositions will likewise be understood to describe corresponding compositions comprising sulfuric acid and/or its desiccating sulfuric acid species and precursors. Examples desiccating sulfuric acid species and precursors of sulfuric acid include sulfur trioxide ($SO_3$), thiosulfuric acid ($H_2S_2O_3$), peroxosulfuric acid ($H_2SO_5$), peroxydisulfuric acid ($H_2S_2O_8$), fluorosulfuric acid ($HSO_3F$), and chlorosulfuric acid ($HSO_3Cl$). In an embodiment of the present invention, a desiccating species of sulfuric acid is a complex of sulfuric acid with an oxidizing agent. Oxidizing agents include $H_2O_2$, $O_3$, or a mixture thereof.

In the method of removing carbon materials and more preferably amorphous carbon, from a substrate as provided herein, a substrate having material on a surface thereof is placed in a treatment chamber. A liquid sulfuric acid composition is dispensed onto the substrate in an amount and manner effective to substantially uniformly coat the substrate surface. For purposes of the present invention, the water/sulfuric acid molar ratio is calculated for compositions comprising the desiccating sulfuric acid species and precursors based on the molar ratio in the final mixture of water to the moles present of the desiccating sulfuric acid species or precursor.

In one embodiment of the present invention, the substrate is pretreated with a pretreatment liquid to facilitate providing a surface wherein a liquid sulfuric acid composition having water/sulfuric acid molar ratio of no greater than about 5:1, when applied to the surface, will substantially uniformly coat on the surface. For purposes of the present invention, a liquid sulfuric acid composition is considered to substantially uniformly coat the substrate if, when sufficient liquid sulfuric acid composition is applied to the surface to completely coat the surface, substantially no beading up of the liquid sulfuric acid composition (i.e. no discontinuities of the liquid on the surface) is observed. The pretreatment composition in one embodiment comprises application of sufficient liquid sulfuric acid composition having water/sulfuric acid molar ratio of no greater than about 5:1 to modify the surface characteristics of the substrate, so that a subsequent (or continuing) application of liquid sulfuric acid composition having water/sulfuric acid molar ratio of no greater than about 5:1 will substantially uniformly coat the substrate. Optionally, other surface modifying components may be used in the pretreatment liquid, such as surfactants or solvents that act to modify the surface characteristics of the substrate as desired.

Also, it has been found that the effectiveness and efficiency of removal of carbon materials from the surface of a substrate is particularly enhanced wherein the liquid sulfuric acid composition has a water/sulfuric acid molar ratio of no greater than about 3:1, or no greater than about 2:1. In a preferred embodiment of the present invention, it has been found that the effectiveness and efficiency of removal of materials from the surface of a substrate is particularly enhanced wherein the liquid sulfuric acid composition having a water/sulfuric acid molar ratio of no greater than about 1:2. In an embodiment of the invention, the liquid sulfuric acid composition does not contain water. For ease in obtaining materials, however, and embodiment of the invention contemplates that the liquid sulfuric acid composition will contain at least as much water as is conventionally present in the raw materials. In another embodiment of the present invention, the liquid sulfuric acid composition has a water/sulfuric acid molar ratio of from about 1:2 to about 1:4.

Stated another way, preferably the liquid sulfuric acid has a concentration by volume greater than about 50 vol %, more preferably greater than 80 vol %, and most preferably greater than 90 vol %. For purposes of the present invention, when volume ratios of sulfuric acid are discussed, it is intended that the content of sulfuric acid is calculated based on 98 wt % sulfuric acid source. Thus, a sulfuric acid/water composition comprising sulfuric acid in a content of 50% by volume comprises 50 vol % of 98 wt % sulfuric and 50 vol % water.

Preferably, the substrate is heated to a temperature of at least about 90° C., either before, during or after dispensing of the liquid sulfuric acid composition. The liquid sulfuric acid composition is exposed to water vapor in an amount effective to increase the temperature of the liquid sulfuric acid composition on the substrate surface above the temperature of the liquid sulfuric acid composition prior to exposure to the water vapor. In an embodiment of the present invention, the liquid sulfuric acid composition is exposed to water vapor in an amount effective to increase the temperature of the liquid sulfuric acid composition on the substrate surface above both (i) the temperature of the on-substrate liquid sulfuric acid composition prior to exposure to the water vapor and (ii) the temperature of the water vapor. Either after or between steps of the above-described treatment, the substrate is preferably rinsed.

It has been found that the amount of water present in the liquid sulfuric acid composition prior to or as applied to the substrate is important to the effectiveness of the removal of undesired carbon material. Specifically, it has been found that sulfuric acid compositions that initially contain too much water are less able to strip carbon material when exposed to water vapor. While not being bound by theory, it is believed that these diluted sulfuric acid compositions are either less able to take up water vapor in an amount effective to increase the temperature of the liquid sulfuric acid composition above the temperature of the liquid sulfuric acid composition prior to exposure to the water vapor, or the chemical activity of the composition is decreased by the water, or both.

In embodiments where the substrate is at an ambient processing temperature below the boiling point of water (particularly in a temperature range of about 20-60° C.), the temperature of the liquid sulfuric acid composition is substantially increased upon addition of water vapor. Surprisingly, it further has been found that even when the substrate and/or the sulfuric acid composition is at a high temperature (e.g. greater than about 90° C.), and particularly at a temperature at or above 100° C., the water vapor is taken up by the liquid sulfuric acid composition even though the temperature of the liquid sulfuric acid composition is near or above the boiling point of water. While not being bound by theory, it is believed that the liquid sulfuric acid has a desiccating effect, thereby causing water from the water vapor to be condensed into the liquid sulfuric acid composition and releasing the energy corresponding roughly to the heat of vaporization stored in the water vapor.

According to one aspect of the present invention, a method of removing carbon material from a semiconductor substrate includes:

providing a semiconductor substrate in a treatment chamber, wherein the semiconductor substrate has a carbon film on at least a portion of a surface thereof;

dispensing a liquid sulfuric acid composition from a first supply line including sulfuric acid and/or its desiccating species and precursors onto the substrate surface in an amount effective to substantially uniformly coat the substrate surface; and exposing the liquid sulfuric acid composition on the substrate surface to water vapor which is dispensed from a second supply line and in an amount effective to increase the temperature of the liquid sulfuric acid composition above the temperature of the liquid sulfuric acid composition prior to exposure to the water vapor, wherein the liquid sulfuric acid composition is at a temperature of at least 130° C. and less than 220° C. prior to exposure to the water vapor; and wherein the liquid sulfuric acid composition on the substrate surface is exposed to water vapor for a time period to remove at least a portion of the carbon film from the surface.

According to another aspect of the present invention, a method of removing carbon material from a semiconductor substrate, includes:

providing a semiconductor substrate in a treatment chamber, wherein the semiconductor substrate includes silicon nitride and/or silicon dioxide and has a carbon film on at least a portion of a surface thereof;

dispensing a liquid sulfuric acid composition from a first supply line comprising sulfuric acid and/or its desiccating species and precursors onto the substrate surface in an amount effective to substantially uniformly coat the substrate surface; and exposing the liquid sulfuric acid composition on the substrate surface to water vapor which is dispensed from a second supply line and in an amount effective to increase the temperature of the liquid sulfuric acid composition above the temperature of the liquid sulfuric acid composition prior to exposure to the water vapor, wherein the liquid sulfuric acid composition on the substrate surface is exposed to water vapor for a time period to remove at least a portion of the carbon film from the surface while less than 8 angstroms per minute of the silicon nitride and/or silicon dioxide is removed from the substrate.

In preferred embodiments, the carbon material includes amorphous carbon and the amorphous carbon is selectively removed as compared to a silicon oxide (e.g., silicon dioxide) and/or silicon nitride.

BRIEF DESCRIPTION OF THE DRAWINGS

FIG. 3B shows one representative mode of practice of using the processor shown in FIG. 1A.

DETAILED DESCRIPTION

The above mentioned and other advantages of the present invention, and the manner of attaining them will become more apparent, and the invention itself will be better understood by reference to the following description of the embodiments of the invention taken in conjunction with the accompanying drawings.

For purposes of the present invention, water vapor is defined as water in the gaseous form, and distinguished from small droplets of water commonly called "mist." Because mist is water that is condensed in the form of small droplets, there is essentially no net warming effect when mist settles on a surface that would correspond to a heat of vaporization. For purposes of the present invention, steam is vaporized water at or above the boiling point of water, which depends on the pressure, e.g. 100° C. if the pressure is 1 atmosphere. When steam is provided at a temperature greater than the boiling point of water, is it called superheated steam. Water vapor optionally may be provided from compositions comprising components in addition to water, such as dissolved gasses such as ozone, or inert gasses such as nitrogen. It is contemplated that water vapor may be supplied to the sulfuric acid composition in any manner, either essentially pure, or in compositions, either above, or below or at 100° C., and having pressures or partial pressures of water vapor either above, below or at 1 atm.

The method of the present invention may be used to process multiple wafer-like objects simultaneously, as occurs with batches of wafers when being processed in a spray processing tool such as the MERCURY® or ZETA® spray processors commercially available from TEL FSI, Inc., Chaska, Minn., or the Magellan® system, also commercially available from TEL FSI, Chaska, Minn. The present invention may also be used in single wafer processing applications where the wafers are either moving or fixed, or in batch applications where the wafers are substantially stationary. An example of a single wafer processing system is the FSI Orion® Single Wafer Cleaning System commercially available from TEL FSI, Inc, Chaska, Minn.

Figure 1:
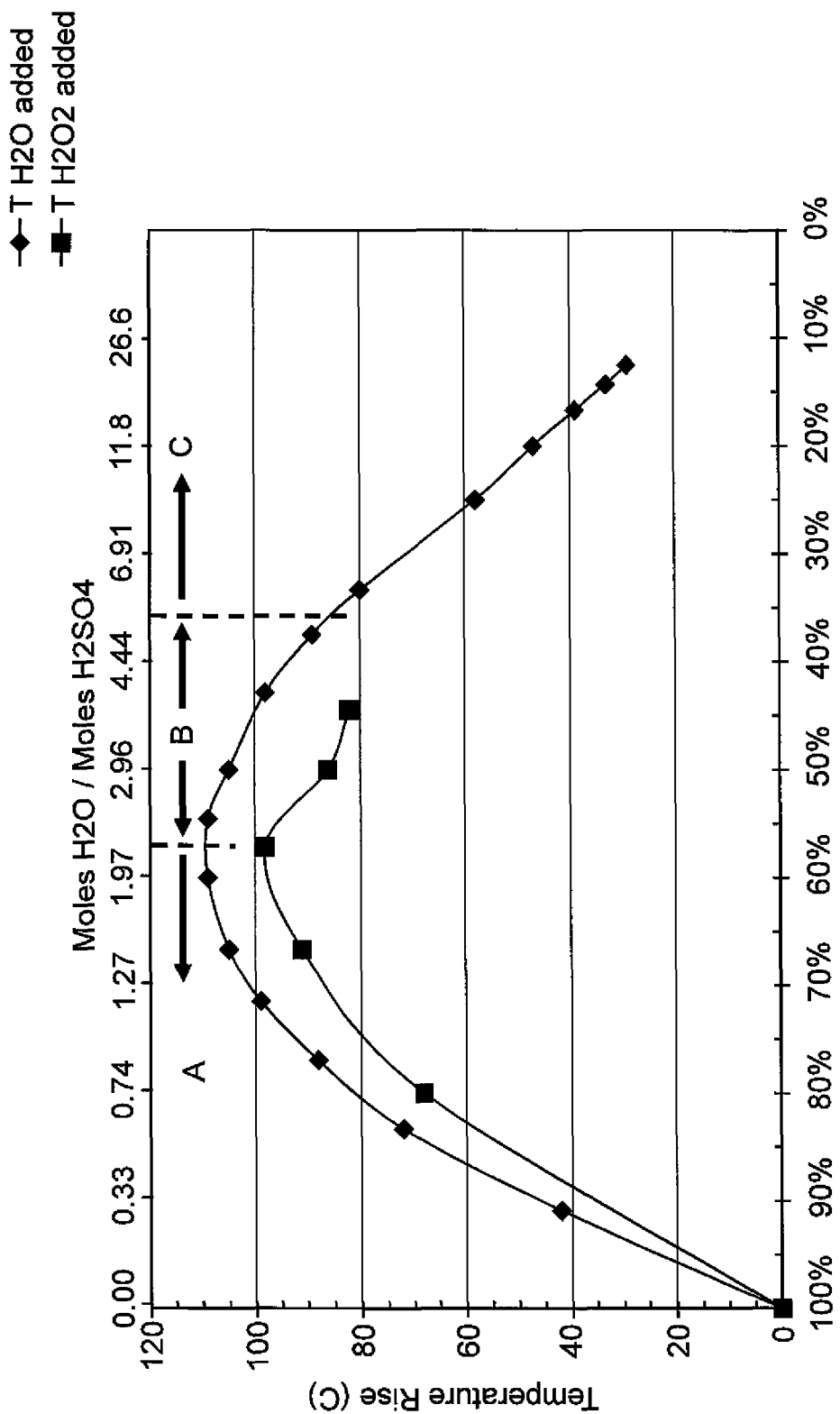
FIG. 1 is a graph showing the resulting temperature rise when liquid water or $H_2O_2$ (30 wt %) is added to $H_2SO_4$ (98 wt %).

With reference to the figures, wherein like numerals are used to label like components throughout the several figures:

FIG. 1 shows the resulting temperature when 20° C. $H_2SO_4$ (98 wt %) is mixed with 20° C. liquid water or 20° C. $H_2O_2$ (30 wt %) in a rapidly stirred beaker. In region A, at $H_2SO_4$ volume fractions between approximately 100% and 57%, the $H_2SO_4$/water blend increases in temperature with increasing water content. In region B, at fractions between approximately 56% and 36%, the $H_2SO_4$/water blend decreases slowly in temperature with increasing water content. In region C, at fractions between approximately 35% and 10%, the temperature of the blend decreases rapidly with increasing water content. The temperature profile of $H_2SO_4$ mixed with $H_2O_2$ follows the same trend, but with a slightly lower maximum temperature. A maximum temperature rise of approximately 110° (130° C. final temperature) is obtained with an $H_2SO_4$/water blend that is a blend of approximately 57 vol % $H_2SO_4$ and 43 vol % $H_2O_2$. Also shown on the top axis is the $H_2O$ to $H_2SO_4$ mole ratio of the water:$H_2SO_4$ blend. The boundaries between regions A and B is approximately 2:1 water:$H_2SO_4$, and between B and C is approximately 5:1.

Figure 2:
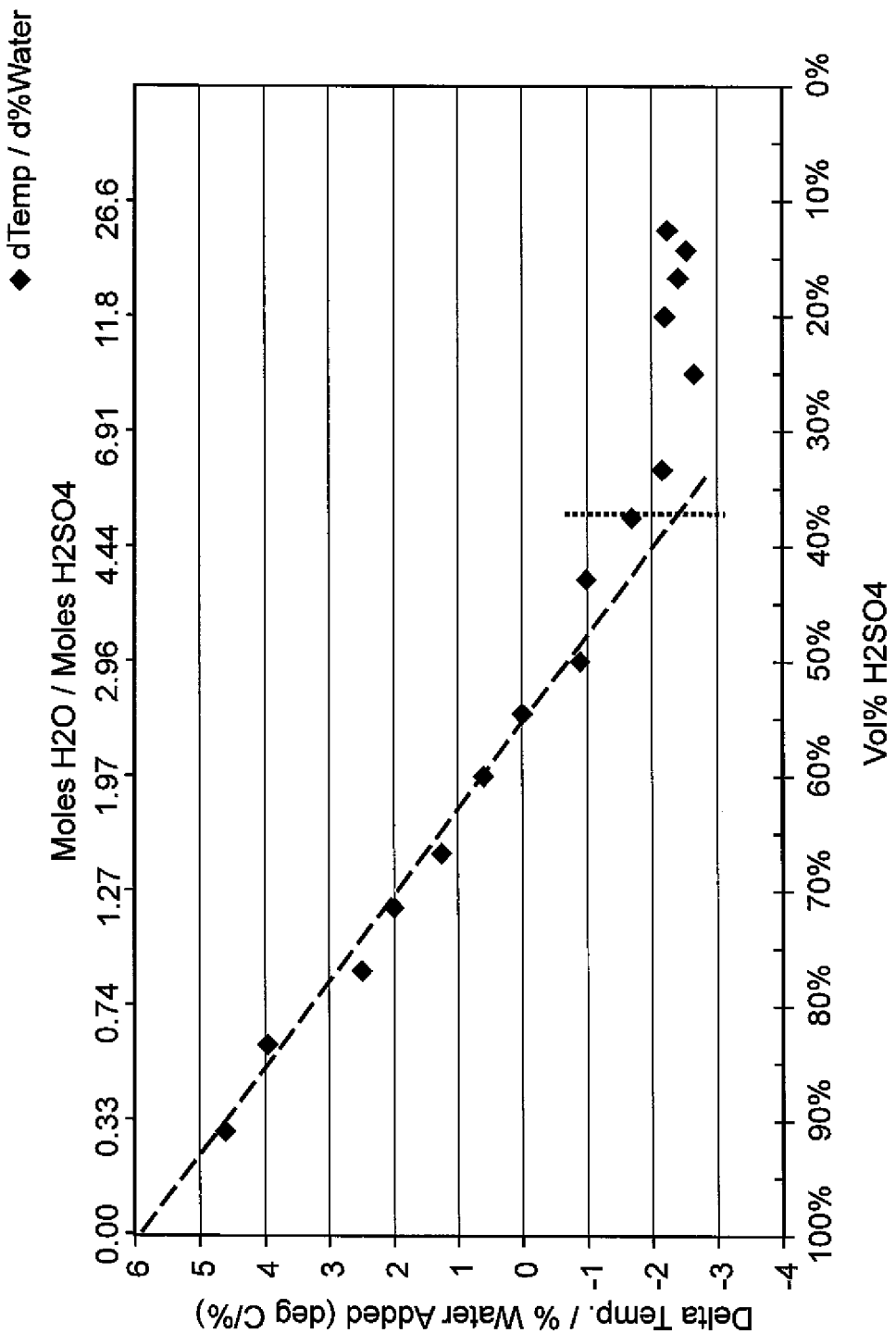
FIG. 2 is a graph showing the temperature rise when liquid water is added to a blend of $H_2SO_4$ (98 wt %)/water as a function of the fraction of $H_2SO_4$ (98 wt %) in the solution.

FIG. 2 shows the derivative of the water-added curve from FIG. 1. This shows the rise in temperature for each percent increase in water content as a function of the fraction of $H_2SO_4$ in the solution. There is an almost linear decrease in dT/dWater from 100% to 37% $H_2SO_4$ fraction. While not being bound by theory, it is believed that the temperature increase of the solution (the heat of mixing) is being caused by the heat of hydration as water molecules coordinate around each sulfuric acid molecule. In the present invention, this strong attraction between the water and sulfuric molecules drives the desiccant action that draws water vapor from the atmosphere and into the sulfuric acid composition, even when the temperature of the sulfuric acid composition is above the boiling point of water. At approximately 55 vol % sulfuric acid, the heat of hydration is balanced by the thermal load of the added water, and additional added water has a net cooling effect on the blend. At approximately 37 vol % $H_2SO_4$, the hydration of $H_2SO_4$ appears to be complete. As shown in the upper x-axis of FIGS. 1 and 2 show the mole ratio of water:$H_2SO_4$ in the solution. The hydration appears to be complete when approximately 5 moles of water are present for each mole of $H_2SO_4$.

In contrast to FIG. 1, the present invention adds water to the sulfuric acid composition by condensation of water vapor into the composition. This results in the heating of the composition not only by the heat of mixing between $H_2SO_4$ and $H_2O$, but also by the water's heat of vaporization that is regained when the water condenses into the sulfuric acid composition. Compared to adding liquid water to $H_2SO_4$, the thermal contribution from water vapor's heat of vaporization allows larger temperature increases for a given amount of dilution.

Figure 3A:
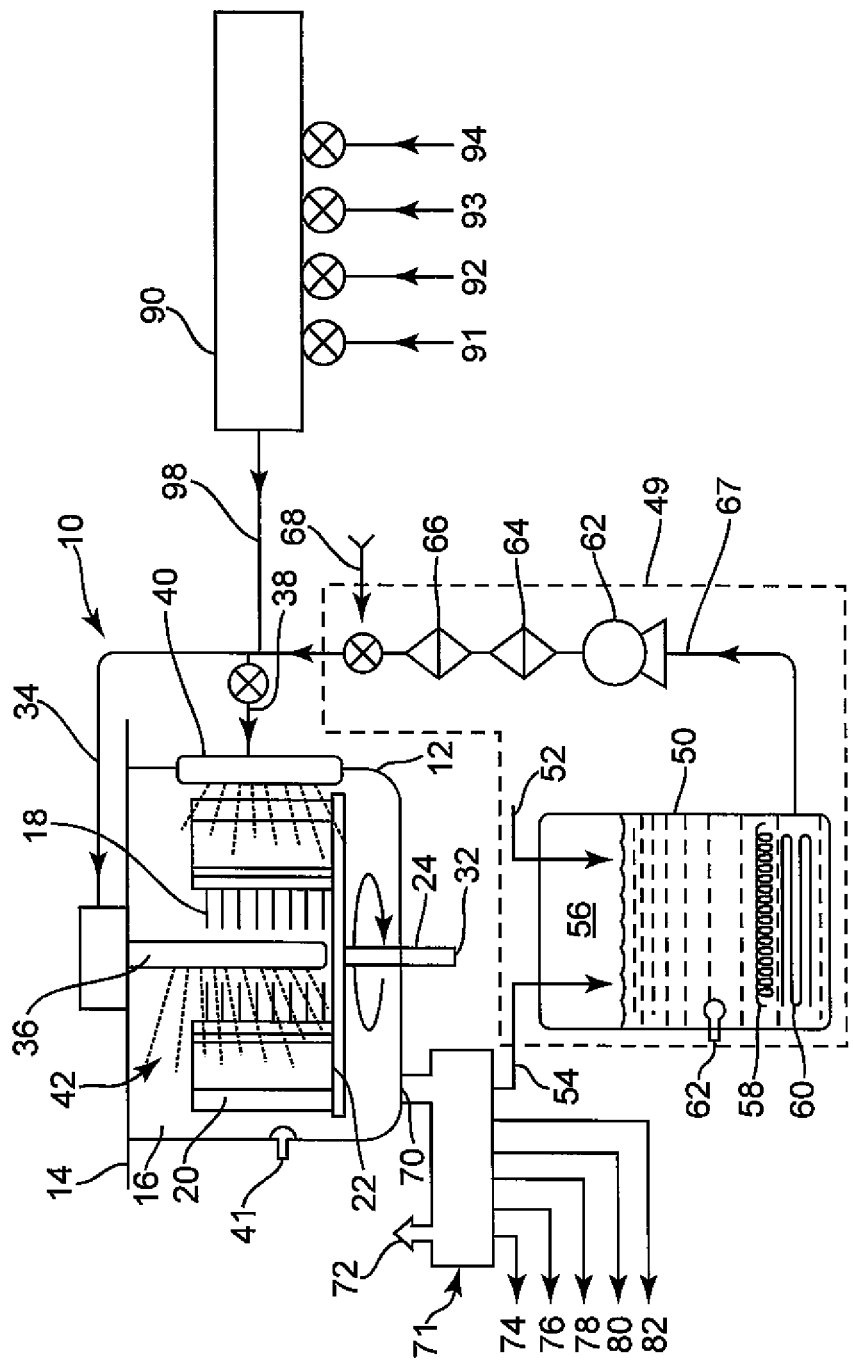
FIG. 3A shows a schematic view of a batch spray processor that can be used to carry out the process of the present invention.

FIGS. 3A and 3B show one example of equipment useful for carrying out the process of the present invention. FIG. 3A shows a schematic view of a batch spray processor 10 showing main system components including chemical mixing manifold 90, recirculation tank 50, and process bowl 12. The equipment 10 is a schematic representation of a spray processing tool such as that included in a MERCURY® or ZETA® spray processor commercially available from TEL FSI, Inc., Chaska, Minn. Equipment 10 generally includes a bowl 12 and lid 14 defining a processing chamber 16. Wafer-like objects 18 are positioned in carriers 20 (e.g., TEFLON® cassettes), which in turn are held upon rotating turntable 22 by turntable posts (not shown). Turntable 22 is coupled to motor-driven shaft 24. Water or nitrogen may be supplied from supply line(s) 32 and dispensed into processing chamber 16 through the turntable posts (not shown). One or more chemicals may also be supplied from supply line(s) 34 and dispensed into processing chamber 16 directly onto the wafers 18 and/or directly onto turntable 22 through center spray post 36 or onto the wafers via the side spray post 40 via line(s) 38.

For example, a supply line 34 can be fluidly coupled to a chemical recirculation system 49. The recirculation system can include chemical supply lines 67 and 68. Chemical supply line 67 can include filters 64 and 66, pump 62, and be fluidly coupled to recirculation supply tank 50. The recirculation supply tank can be supplied with process chemical from recirculation drain 54 and fresh chemical makeup 52. A nitrogen blanket 56 can be used in the headspace of tank 50. To control temperature of the process chemical in tank 50, tank 50 can include a heating coil 58, cooling coil 60, and temperature probe 41. Chemical supply line 68 can supply, e.g., nitrogen and DI water rinse. After supplying chemical to processing chamber 16, any unused chemical can enter drain 70 and pass into drain manifold 71. From the drain manifold, the chemical can be directed to a variety of outlets such as recirculation drain 54, exhaust 72, DI drain 74, auxiliary 76, auxiliary 78, auxiliary 80, and auxiliary 82.

Supply line 34 can also be fluidly coupled to a fresh chemical blending manifold 90. In the manifold, controlled flows of fresh chemicals from lines 91-94 are mixed to form a desired blend that is sent to the center spray post 36 via line(s) 98 and 34 or to the side spray post 40 via lines 98 and 38. Optionally, the chemical blend can be heated by an in-line infra-red heater in line 98 (heater not shown). Alternately, one or more of the feed chemicals can be heated by an infra-red heater placed in one or more of lines 91-94.

The configuration and use of equipment 10 has been further described in U.S. Pat. Nos. 5,971,368; 6,235,641; 6,274,506; 6,648,307; and 7,422,031, said patents being incorporated herein by reference in their entireties.

FIG. 3B shows one representative mode of practice of using the equipment 10 in accordance with the present invention. A liquid sulfuric acid composition 42 is dispensed onto wafers 18 from center spray post 36 and/or side spray post 40 (not shown) in an amount effective to substantially uniformly coat the carbon material (e.g., carbon film) coated on substrate 18. This substantially uniform coating may be facilitated by pretreatment, for example, using the same apparatus, with a pretreatment liquid to provide a surface wherein a liquid sulfuric acid composition having water/sulfuric acid molar ratio of no greater than about 5:1, when applied to the surface, will substantially uniformly coat on the surface. As noted above, the pretreatment composition may for example be a preapplication of liquid sulfuric acid composition to modify the surface characteristics of the substrate, so that a subsequent (or continuing) application of liquid sulfuric acid composition having water/sulfuric acid molar ratio of no greater than about 5:1 will substantially uniformly coat the substrate. Optionally, other surface modifying components may be used in the pretreatment liquid, such as surfactants or solvents that act to modify the surface characteristics of the substrate as desired. Additional components may be added to provide chemical modification of the pretreatment solution. For example, a minor amount of acid may be added to an aqueous pretreatment solution.

After (or while, or before) the liquid sulfuric acid composition 42 is dispensed, hot water 44 is dispensed onto turntable 22. Evaporation of a portion of the hot water 44 increases the water vapor content (humidity) of the chamber atmosphere.

Methods according to the present invention can be used to remove at least a portion of carbon material from a surface of a semiconductor substrate.

Carbon material to be removed from a surface of a semiconductor surface is typically present as a film coating. Exemplary carbon film materials include amorphous carbon, diamond-like carbon, and graphitic carbon, which are all well known materials. Although some short-range order may be observed in amorphous carbon, amorphous carbon generally lacks any significant crystalline structure. In some embodiments, amorphous carbon materials may be stabilized with hydrogen (referred to as hydrogenated amorphous carbon).

In some embodiments, a carbon film is deposited on a semiconductor substrate (e.g., as a hard mask or a patterned hard mask) and then the semiconductor substrate is subjected to at least one treatment in the presence of the carbon film (e.g., etching features in a substrate). For example, a carbon film can be patterned on a substrate and then features of the substrate can be etched using the patterned carbon film as a mask. A carbon film may be deposited on a substrate using different deposition methods, including plasma-enhanced CVD and thermal CVD in the absence of a plasma. The deposition of the carbon films can use a hydrocarbon gas, and optionally a noble gas and/or an oxygen-containing gas. Applying and using a carbon films such as amorphous carbon as a hard mask is well known and is disclosed in, e.g., U.S. Pat. No. 8,343,713, the entirety of which patent is incorporated herein by reference for all purposes. A hard mask can include materials used in processing as an etch mask in lieu of polymer or other organic "soft" resist materials. Applying a diamond-like coating to a substrate is also well known and is disclosed in, e.g., U.S. Pat. No. 8,394,455, the entirety of said document being incorporated herein by reference for all purposes. And applying graphitic carbon to a substrate is well known and disclosed in, e.g., WO2011084334, the entirety of said document being incorporated herein by reference for all purposes.

Optionally, a carbon film may be implanted with one or more types of chemical elements during processing (e.g., etching of underlying layers using the carbon films as a patterned hard mask). The patterned carbon films can then be removed from the substrate in a cleaning process according to the present invention following the processing.

Carbon material to be removed according to the present invention can be doped or undoped. In some embodiments, the carbon material includes at least one dopant. Exemplary dopants include one or more of B, P, As, Sb, Si, Ge, Ti, Ta, or Al, or combinations thereof Carbon films can be present on semiconductor substrates prior to removal in a wide range of thickness. In some embodiments, a carbon film that is to be removed from a substrate has a thickness in the range from 100 angstroms to 20,000 angstroms, preferably from 1000 angstroms to 15,000 angstroms. For example, a carbon film can have a thickness of at least 1000 angstroms, preferably at least 2000 angstroms, and even more preferably at least 5000 angstroms.

As mentioned, in some embodiments, the carbon film is present as a hard mask (etch mask) with respect to other materials present on or in the semiconductor substrate. For example, the semiconductor substrate can include other materials (e.g., one or more layers) such as oxide layers (e.g., silicon dioxide) and/or silicon nitride. An exemplary semiconductor substrate is illustrated as wafer 18.

Preferably, methods of removing at least a portion of a carbon material according to the present invention can selectively remove at least a portion of a carbon film (e.g., patterned amorphous carbon) relative to an oxide layer (silicon dioxide) and/or silicon nitride. In preferred embodiments, substantially all of a carbon film can be selectively removed. For example, carbon material can be removed according to the present invention such that there is no remaining visible carbon material on the surface of the semiconductor substrate and/or no residual amount of carbon material is detected on the surface of the substrate using a detection instrument such as an ellipsometer.

According to the present invention, the carbon material can be removed selectively as compared to other layers such as oxide layers and/or silicon nitride. In some embodiments, at least a portion of the carbon material is removed while less than 8 angstroms per minute of silicon nitride and/or silicon dioxide is removed from the substrate, preferably 7 angstroms or less, preferably 6 angstroms or less, preferably 5 angstroms or less, preferably 4 angstroms or less, preferably 3 angstroms or less, preferably 2 angstroms or less, preferably 1 angstrom or less, even more preferably 0.5 angstroms or less.

A method of removing carbon material according to the present invention can be performed within any desired time period. Preferably, a liquid sulfuric acid composition is dispensed onto a substrate such as wafer 18 for 5 minutes or less, preferably 2 minutes or less, preferably 1 minute or less, and even more preferably 30 seconds or less.

The liquid sulfuric acid composition 42 has a water/sulfuric acid molar ratio of no greater than about 5:1. Thus, the liquid sulfuric acid composition is limited in water content.

More preferably, the liquid sulfuric acid composition is highly concentrated. Preferably, the liquid sulfuric acid composition is dispensed at a sulfuric acid concentration of at least about 80 vol %, more preferably at least about 90 vol %, and most preferably at least about 94 vol %. As shown in FIGS. 1 and 2, these high $H_2SO_4$ concentrations result in the largest temperature rise per unit of water vapor condensed into the $H_2SO_4$ composition.

In an embodiment of the present invention, the liquid sulfuric acid composition 42 comprises hydrogen peroxide. The hydrogen peroxide serves as an oxidant that assists in breaking down carbon material to $CO_2$ and water. Hydrogen peroxide is conveniently provided in a water-containing solution blended with concentrated sulfuric acid to provide a liquid sulfuric acid composition having water/sulfuric acid molar ratio of no greater than about 5:1. Advantageously, mixing of concentrated sulfuric acid with a water-containing hydrogen peroxide solution generates heat by an exothermic reaction, and so the resulting liquid sulfuric acid composition comprising hydrogen peroxide can be provided at elevated temperature while using less energy from a dedicated heat source to heat the composition. This exothermic reaction is normally a significant source of heat for the composition. However, in the present invention the reaction between the sulfuric acid composition and water vapor provides the desired heat, and excess additions of water-based hydrogen peroxide can inhibit this sulfuric-vapor reaction. Therefore, with the knowledge of the effect of vapor in concentrated sulfuric acid compositions as described herein, the skilled artisan can now adjust the $H_2O_2$ concentration to simultaneously optimize the heat generated by the $H_2SO_4$-vapor reaction while supplying sufficient reactants to oxidize carbon material. In some embodiments, the $H_2O_2$ concentration is in a range from 20 vol % to 40 vol %, e.g., about 30 vol %. Preferably, the hydrogen peroxide is at a temperature prior to being introduced into the liquid sulfuric acid composition that does not cause the hydrogen peroxide to degrade to an undue degree. For example, in some embodiments, the hydrogen peroxide is at about room temperature prior to being introduced into the liquid sulfuric acid composition.

In an aspect of the present invention, an oxidizing agent can be introduced into the treatment chamber before, during or after dispense of the liquid sulfuric acid composition. For example, hydrogen peroxide can be mixed with the liquid concentrated sulfuric acid prior to introduction of the liquid sulfuric acid composition into the treatment chamber, or alternatively during or after dispense of the liquid sulfuric acid composition in the treatment chamber. Mixing of the hydrogen peroxide with the liquid concentrated sulfuric acid can be accomplished by the use of static mixers or active mixing techniques, or can be merely contacting one solution with the other, with mixing being accomplished by mere diffusion. Other agents, such as ozone, may be similarly incorporated in the liquid sulfuric acid composition as desired. Water-free oxidants such as ozone may be superior to $H_2O_2$ as they will not dilute the $H_2SO_4$ composition. For example, oxidants other than $H_2O_2$ may be utilized in the inventive sulfuric-vapor process. For instance, ozone, nitric acid, the chromate ion ($Cr^{+6}$), or the ceric ion ($Ce^{+4}$) may be incorporated in the process as described herein. In particular, these species might be added to $H_2SO_4$ in an anhydrous form, so that the $H_2SO_4$ remains relatively undiluted. Other oxidants may also be used.

Preferably, as similarly discussed above with respect to the concentration of hydrogen peroxide, the molar ratio of $H_2SO_4$ to $H_2O_2$ can be selected to balance the heat generated by the $H_2SO_4$-vapor reaction while supplying sufficient reactants to oxidize the carbon material. In some embodiments, the molar ratio of $H_2SO_4$ to $H_2O_2$ can be in a range from 5:1 to 20:1, preferably from 10:1 to 16:1.

Preferably, the liquid sulfuric acid composition is dispensed at a temperature of at least about 90° C., and more preferably from about from about 90° C. to about 150° C. In another embodiment, the liquid sulfuric acid composition is preferably dispensed at a temperature of from about 95° C. to about 120° C. In another embodiment, the liquid sulfuric acid composition is dispensed at a temperature of at least about 130° C. prior to exposure to the water vapor, and more preferably in a range from 130° C. to less than 220° C., preferably in a range from 160° C. to 200° C., preferably in a range from 160° C. to 180° C. prior to exposure to the water vapor. In other embodiments, the liquid sulfuric acid composition is dispensed at a temperature in a range from 200° C. to less than 220° C. prior to exposure to the water vapor. The introduction of the liquid sulfuric acid composition 42 wets the wafer surfaces with the sulfuric acid chemistry. Preferably liquid sulfuric acid composition 42 is applied to the wafer in an amount to provide sufficient sulfuric acid functionality to remove the carbon material coated on wafer 18. Preferably, the liquid sulfuric acid composition is dispensed onto the carbon material coated substrate to a thickness of at least about 5 microns, more preferably to a thickness of at least about 10 microns. In an embodiment of the present invention, the liquid sulfuric acid composition is dispensed onto the carbon material coated substrate to a thickness of from about 10 microns to about 140 microns, and preferably to a thickness of from about 10 microns to about 60 microns.

In one embodiment, wafers 18 are provided at a temperature below the boiling point of water, such as at a temperature of from about 20 to about 60° C. Wafers 18 are preferably heated to a temperature of at least about 90° C., either before, during or after dispensing of the liquid sulfuric acid composition. More preferably, wafers 18 are heated to a temperature of from about 90° C. to about 150° C. In another embodiment, the wafers are heated to a temperature of from about 95° C. to about 120° C. This heating can be carried out, for example, by heating the chamber using radiant heat, introduction of hot water or other liquid solution to the wafer with substantial removal of the heated liquid prior to application of the concentrated sulfuric acid composition, introduction of heated gases to the chamber, and the like. If a liquid is used to heat the wafer by direct contact to the wafer, sufficient amount of the liquid is removed from the wafers prior to introduction of the concentrated sulfuric acid composition so that the concentrated sulfuric acid composition maintains the desired level of sulfuric acid concentration prior to the exposure of the liquid sulfuric acid composition to water vapor.

In one embodiment of the present invention, the wafers can be preheated by submerging one or more wafers into a heated bath of liquid, quickly draining the contents of the bath (e.g. a "quickdump" procedure) and conducting the remaining treatment steps as described below. The bath liquid can be, for example, DI water, DI water containing sulfuric acid, sulfuric acid/hydrogen peroxide mixture, an inert fluid (such as a fluorocarbon), sulfuric acid/ozone mixture, and the like. This embodiment can provide substantial benefit in enhancing throughput of the treatment process by more efficiently heating the wafers. An example of a particularly suitable process system that can be used to employ this embodiment is the Magellan® system commercially available from TEL FSI, Chaska, Minn., Water vapor is introduced to the chamber in any appropriate manner. As shown in FIG. 3B, heated DI water 44 is splashed down onto the rotating turntable 22 from the bottom 46 of center spray post 36. In this "splashdown" approach, water vapor is generated. Alternatively, water vapor can be generated inside the treatment chamber by any appropriate alternative water vapor generation technique, such as by heating and/or agitating water in the treatment chamber. In yet another alternative, the water vapor can be generated outside of the treatment chamber and introduced to the treatment chamber in the desired water vapor form. For instance, externally produced water vapor could be supplied to the chamber as a gas, or as component of a mixture of gasses. In one embodiment, vapor could be produced by bubbling a gas (eg. $N_2$) through a column of water (preferably hot water). In another embodiment, the gas could pass over the surface of a quantity of water. In another embodiment, the gas could pass through an irrigated packed column as commonly used in chemical engineering. In another embodiment, substantially pure water vapor could be produced by boiling liquid water. The gaseous products from any of these alternatives could be further heated. Other embodiments are also possible. In an exemplary embodiment, steam can be generated externally from the chamber at a pressure of about 28 psi and after it enters the chamber it is at about 20 psi. An exemplary steam flowrate includes about 100 slm.

Preferably, the water vapor is introduced so that it is exposed to the wafers at a water vapor temperature of from about 70° C. to about 150° C. For example, in some embodiments for this purpose, the water vapor is at a temperature greater than 85° C. prior to exposure to the liquid sulfuric acid composition, preferably at a temperature greater than 120° C. (e.g., 130° C.) prior to exposure to the liquid sulfuric acid composition. In some preferred embodiments, the water vapor is introduced so that it is exposed to the wafers at a water vapor temperature of from about 80° C. to about 110° C. In a particularly advantageous embodiment, the water vapor is introduced so that it is exposed to the wafers at a water vapor temperature of from about 85° C. to about 98° C. This embodiment is advantageous because the water vapor is easy to generate by the "splashdown" approach described above. Because the water is not at the boiling point, control of entry of the stream of water without undue spattering is easier to accomplish. In different advantageous embodiment, the water vapor is introduced so that it is exposed to the wafers at a water vapor temperature of about 100° C. This embodiment is relatively easy to carry out by boiling water under conventional conditions to form steam either inside or outside the treatment vessel by conventional steam forming apparatus.

In another embodiment, the water vapor is provided at a temperature greater than the temperature of the liquid sulfuric acid composition prior to exposure to the water vapor. This embodiment provides the benefit of direct heating of the liquid sulfuric acid composition by direct heat transfer, as well as the transfer of energy upon condensation of the water vapor into the liquid sulfuric acid as discussed above. In an embodiment, the water vapor is provided at a temperature greater than about 150° C. for this purpose.

Optionally, the water vapor can additionally comprise another agent, such as hydrogen peroxide or ozone, as desired.

The water vapor is introduced into the treatment chamber in an amount effective to increase the temperature of the liquid sulfuric acid composition above the temperature of the liquid sulfuric acid composition prior to exposure to the water vapor, and preferably additionally above the temperature of the water vapor. In an embodiment of the present invention, the liquid sulfuric acid composition is exposed to water vapor in an amount effective to increase the temperature of the liquid sulfuric acid composition on the substrate surface above both (i) the temperature of the on-substrate liquid sulfuric acid composition prior to exposure to the water vapor and (ii) the temperature of the water vapor. Surprisingly, even when the temperature of the liquid sulfuric acid composition is near or even above the boiling point of water, the water vapor still associates with the liquid sulfuric acid composition in a manner to increase the temperature of the liquid sulfuric acid composition, thereby enhancing the carbon material removing effectiveness of the increase the temperature of the liquid sulfuric acid composition.

Preferably, sufficient liquid sulfuric acid composition and water vapor are present and mixed to increase the temperature of the liquid sulfuric acid composition by at least about 20° C., more preferably by at least about 40° C., and more preferably by at least about 60° C. This is particularly significant since the liquid sulfuric acid composition is in place on the wafer, which itself acts as a heat sink and absorbs substantial energy to maintain a temperature that is close to the temperature of the liquid sulfuric acid composition. The temperature of the liquid sulfuric acid composition on the substrate surface can be determined by any appropriate measuring technique. For purposes of the present invention, an appropriate temperature approximation can be made by using temperature probe 41 to measure the temperature of liquid cast onto the treatment vessel walls during spinning of the wafer carriers on turntable 22. To carry out this measurement, a temperature probe may be positioned within the treatment vessel. In one embodiment, a color-changing temperature indicating material may be used to indicate the maximum temperature reached in the treatment vessel.

The exposure of the liquid sulfuric acid composition to water vapor can be carried out at any time effective to increase the temperature of the liquid sulfuric acid composition when in place on the carbon material coated substrate. In one embodiment, water vapor is introduced to the treatment chamber during the dispense of the liquid sulfuric acid composition. It will be appreciated that in this embodiment, the temperature of the liquid sulfuric acid composition may begin to increase even prior to contact of the composition with the substrate. In this embodiment, the increase of the temperature of the liquid sulfuric acid composition upon exposure to water vapor as discussed above can be taken to be the difference between the temperature of the liquid sulfuric acid composition at dispense and the maximum temperature of the liquid sulfuric acid composition after exposure to water vapor.

In another embodiment of the present invention, the liquid sulfuric acid composition is provided to the wafers not in a continuous stream, but rather in a plurality of discrete pulses. These pulses are preferably short (i.e. from about 3-10 seconds in length), and at high flow (i.e. at a flow rate of about 2-8 lpm). There preferably is a time period of about 5 to 20 seconds between pulses with no flow of liquid. When operating with pulsed liquid flow, water vapor optionally is only introduced during the pulse, reducing the amount of water vapor that is flushed from the chamber during the present process. Likewise, water vapor can be optionally introduced during the pulse, to enhance the temperature rise of the sulfuric acid composition before its contact with the substrate, or between pulses, to emphasize the heating of the composition while on the substrate.

In another embodiment, the dispense of the liquid sulfuric acid composition is stopped prior to introduction of the water vapor. In an aspect of this embodiment, the substrate is provided with a coating of the liquid sulfuric acid composition that is relatively stagnant. Optionally, rotation of the substrate is slowed to a rate of less than about 20 rpm or stopped during and/or after dispense of the liquid sulfuric acid composition, and during exposure of the liquid sulfuric acid composition to the water vapor. This process is carried out to promote maintenance of this coating (or "pooling") of liquid sulfuric acid composition on the substrate. While not being bound by theory, it is believed that because the liquid sulfuric acid composition exhibits little bulk motion especially during exposure of the liquid sulfuric acid composition to the water vapor, the liquid tends to dissolve and/or otherwise remove the undesired materials on the surface of the substrate at a comparable rate across all points on the substrate. This enhanced uniformity may be due to uniform exposure of the liquid sulfuric acid composition to the water vapor. Additionally or alternatively, the enhanced uniformity of removal of undesired material (in particular, removal of $SiO_2$) may be due to uniform saturation rates of the liquid sulfuric acid composition by the dissolved undesired material across the coating. The dispense of the liquid sulfuric acid composition may further be modified by varying the thickness of the liquid sulfuric acid composition layer by varying the flow rate, dispense time, and the rate of removal of the liquid sulfuric acid composition by centrifugal force. Further, the aggressiveness of removal of undesired material may be increased by ramping off the spent sulfuric acid solution mixture after the vapor step, applying a fresh layer of sulfuric acid solution mixture, and re-introducing vapor into the chamber.

As noted above, the liquid sulfuric acid composition 42 is dispensed onto wafers 18 from spray posts 36 and/or 40. In certain configurations of wafer treatment equipment, positioning of the spray posts and direction of flow of fluid from the posts have been found to impact the performance of the present process. In certain wafer treatment apparati having a fixed spray post configuration, dispensed fluid tends to be deposited in a manner leading to heavy concentrations of liquid at portions of the wafer. For example, liquids dispensed from the center spray post 36 tend to be deposited on the substrate at heavy concentrations near the center spray post. Also, at some orientations of the turntable 22, a large fraction of the liquid from the center spray post can pass between the wafers and be wasted. Advantageously, superior deposition efficiency and uniformity can be achieved by using the side-bowl spray post 40 (SBSP.) But spray dispensed by the SBSP normal to the face of the chamber, directly toward the turn table's axis of rotation, also tends to deposit liquid excessively near the center spray post. The normal spray further wastes liquid that passes between the wafers at some orientations of the turn table. Superior deposition patterns may be observed by angling the spray of liquids from the spray posts (and particularly the SBSP) off normal from the major surface of the chamber and/or away from the center of the turntable. While angled spray results in a less "focused" deposition near the CSP, no individual angle suffices for uniform coverage. The angle of spray in an embodiment of the invention is stationary. In another embodiment of the invention, the turntable holding the substrate(s) is rotating during dispense of the liquid sulfuric acid composition onto the surface of the substrate, and the liquid sulfuric acid composition is dispensed by spraying the liquid at a varying angle relative to the turntable in a sweeping motion. In one aspect of this embodiment, the angle of spray varies during a single dispense of the liquid sulfuric acid composition. In another aspect of this embodiment, the angle of spray varies from one dispense of the liquid sulfuric acid composition to the next when a plurality of liquid dispenses are carried out in a treatment cycle.

Varying the angle of spray of the liquid sulfuric acid composition (or "sweeping") results in varying the location of the spray's focus, leading to more uniform liquid deposition. Varying the spray's angle of incidence on the wafer-carrier system also reduces the effects of shadowing by structural members of the cassette and turntable. It is possible to vary the angle of the spray in many ways including, for instance, rotating the spray mechanism or spraying through multiple spray mechanisms at varying angles.

Figure 8:
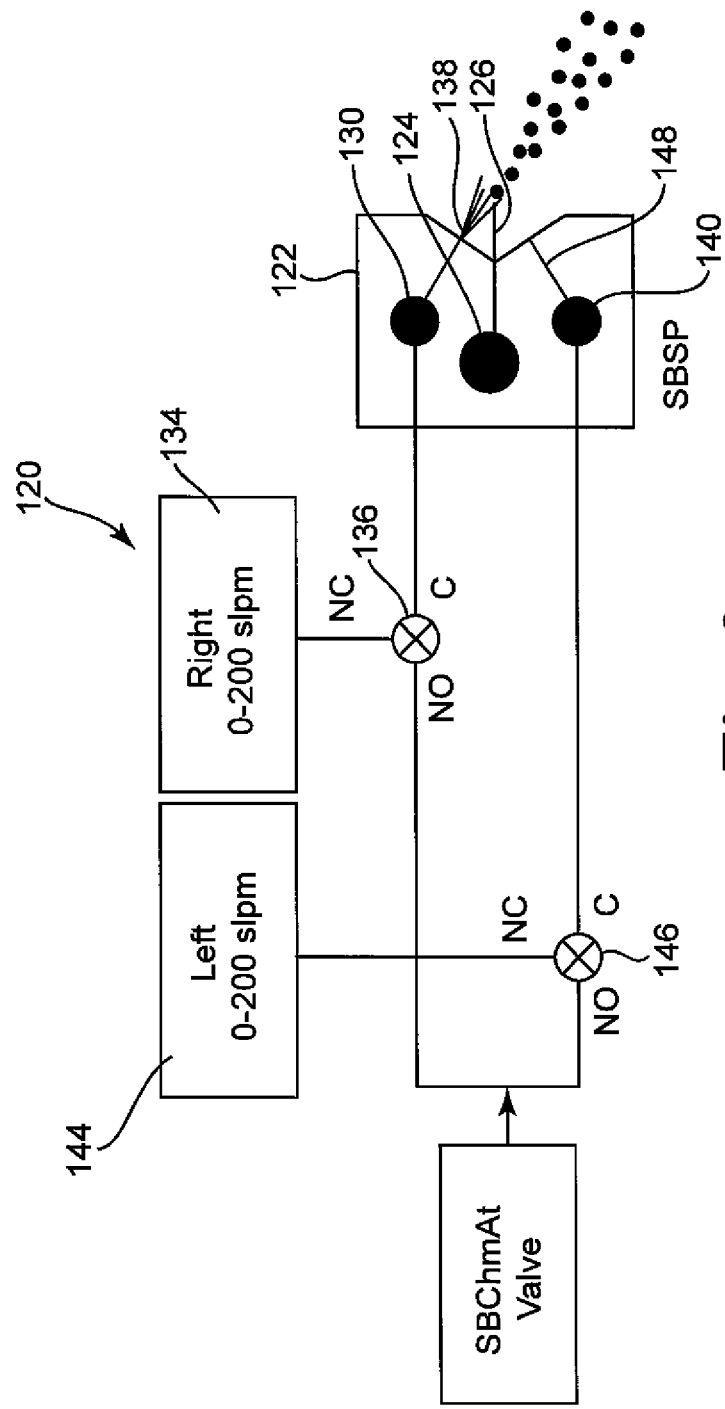
FIG. 8 shows a system for directing a spray using a three orifice nozzle.

A preferred method and apparatus of varying the direction of the SBSP's 40 spray is shown in FIG. 8, which shows a system 120 for directing a spray using a three orifice nozzle 122. In this nozzle, a central orifice 124 is provided with liquid from a liquid source (not shown) under sufficient pressure to eject a stream 126 of liquid therefrom. Gas orifice 130 is provided with a gas from gas source 134 through control valve 136. The gas is provided at a regulated pressure to eject a stream of gas 138 from orifice 130 that simultaneously deflects and atomizes the spray. Similarly, gas orifice 140 is provided with a gas from gas source 144 through control valve 146. The gas is provided at a regulated pressure to eject a stream of gas 148 from orifice 140 that simultaneously deflects and atomizes the spray. The spray direction can be adjusted by modifying the flow of gas streams 138 and 148 to impart a direction to the flow of the liquid spray. Finer gradations of gas flow allow finer adjustment of the spray direction. Equal flows from the two gas sources result in a spray pattern centered perpendicular to the face of the spray mechanism. The spray can be deflected discretely (e.g. 10 seconds at +20°, then 10 seconds at +30°, etc.), or swept continuously. The gas flows can be modulated over a continuous range, such as by mass flow controllers, or discretely, as by multiple orifices. This system 120 is particularly advantageous for use in treatment of semiconductor wafers, because it provides excellent directional and force control of spray of liquid. Furthermore, this excellent control is provided without the need to install an apparatus having moving parts in the treatment chamber. The minimization of the amount of moving parts in treatment chambers is desirable because moving parts increases the likelihood of introduction of small particles in the chamber due to frictional wear of moving components. Additionally, service of equipment is greatly simplified if the equipment is not located in the treatment chamber.

In the case of either stationary or sweeping spray introduction of liquid sulfuric acid composition into the treatment chamber, the direction of the spray preferably is coordinated with the rotation of the substrates in the chamber. In an embodiment of the present invention, spray is angled into the oncoming wafers as they rotate in the chamber on a turntable. That is, the spray from the side-bowl spray post 40 is deflected to the right during clockwise rotation of the turntable and left during counterclockwise rotation.

In another embodiment of the present invention, the effects of shadowing by structural members of the cassette and turntable and/or the overconcentration of liquid at certain locations in the chamber can be ameliorated by placement of deflecting members in the chamber to interrupt or block the flow of the spray in certain directions. These members can be supported by the bowl 12 or lid 14 and thus be substantially stationary, or can be supported by the turntable 22, and thus be at a substantially fixed location with respect to the rotating wafers.

In embodiments of the present invention, it is contemplated that the substrate may be pretreated to assist in removal of the carbon material therefrom.

Additional manipulation steps are also contemplated during the described method, such as exposure of the substrate to megasonic energy before, during or after treatment by the liquid sulfuric acid composition.

An apparatus for use in the present method can be prepared by modifying a known programmable spray processing machine such as a centrifugal spray processor of the type commercially available from TEL FSI, Chaska, Minn., under one or more of the trade designations MERCURY® or ZETA®, by providing the chemical reservoirs thereof with the necessary solutions and by configuring the machine's controller with a program as indicated herein. It will be understood that other known batch spray and single wafer spray machines can similarly be modified to carry out the present invention.

Figure 7:
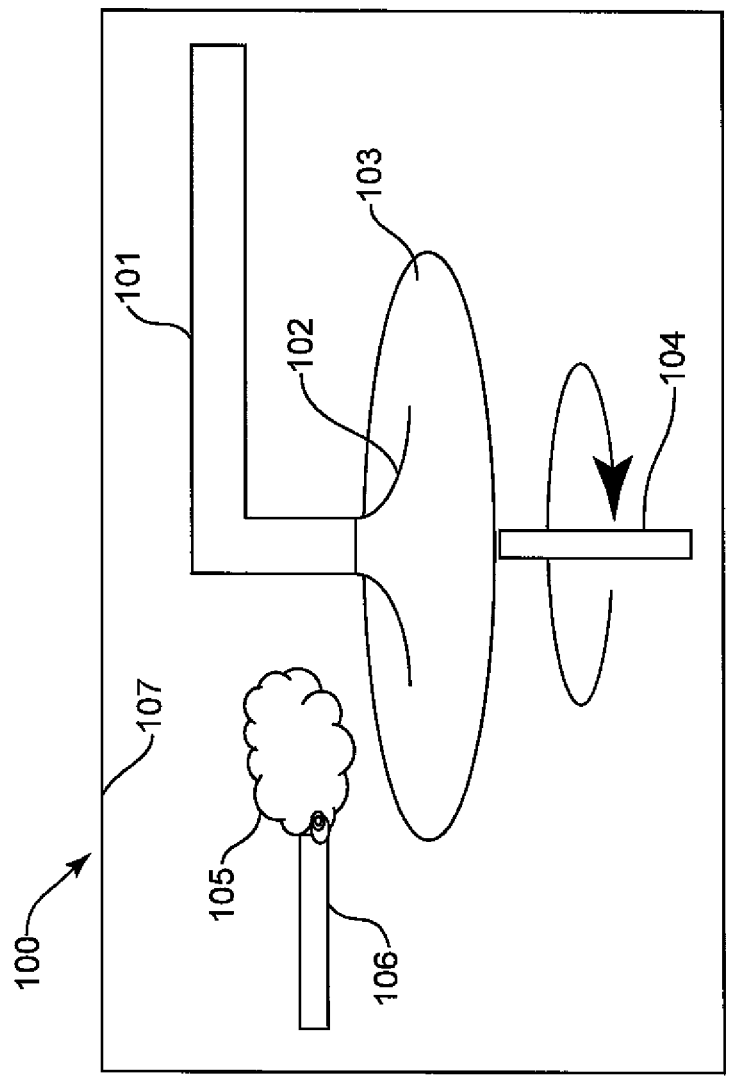
FIG. 7 shows a schematic view of a single-wafer processor that can be used to carry out the process of the present invention.

In another embodiment, the inventive process could also be applied to one wafer at a time in a "single wafer" mode. FIG. 7 shows one embodiment of such a single wafer process apparatus 100 with a sulfuric acid composition 102 being dispensed on a wafer 103 from a duct 101 as the wafer is supported on a holding chuck (not shown) mounted on the shaft of a motor 104. Water vapor 105 is introduced through duct 106. The apparatus is in a chamber 107 sufficiently closed such that the desired levels of vapor can be maintained at the wafer surface.

In one embodiment, apparatus 100 can be operated with a continuous dispense of sulfuric acid composition from duct 101, with duct 101 either stationary or moving relative to wafer 103. Vapor can be introduced into the apparatus either before, during, or after the start of the dispense.

In another embodiment, the entire wafer is wetted with the sulfuric acid composition and the dispense stopped, allowing the composition to form a film on the wafer of relatively uniform thickness. In this embodiment, the wafer can be provided with a coating of the liquid sulfuric acid composition that is relatively stagnant as discussed above. Optionally, rotation of the substrate is slowed or stopped to promote maintenance of this coating of liquid sulfuric acid composition on the substrate. Vapor can be introduced into the apparatus either before, during, or after the start of the dispense. Optionally, the dispense can be repeated to provide a fresh supply of reactants to the wafer surface. Optionally, the wafer can be rapidly rotated between dispenses to cast off most of the sulfuric acid composition present on the wafer. Optionally, the wafer can be coated with a thin layer of sulfuric acid composition by moving dispense duct 101 in a manner used in the semiconductor industry to create thin layers of resist.

In an embodiment of the present invention, the sulfuric acid composition arrives at the wafer surface at substantially the temperature at which it left dispense duct 101. In one embodiment, it may be beneficial to break the composition into small droplets that can absorb vapor and heat up before contacting the wafer. Such droplets can be created, for instance, by atomizing the sulfuric acid composition with the vapor composition or with another gas, or by passing the sulfuric acid composition through a spray nozzle, or by other techniques. It may be beneficial to move this source of heated sulfuric acid composition mist over the wafer.

In an embodiment of the present invention, the sulfuric acid composition can be preheated before it leaves the dispense duct 101 by contacting the composition with a gas comprising water vapor. For example, a gas comprising water vapor could be combined with the sulfuric acid composition at a "T" in a heat resistant tube (eg. quartz). This embodiment offers the advantage that the sulfuric acid composition temperature attained can be much higher than the temperatures of the as-blended sulfuric acid composition or the vapor.

Figure 9:
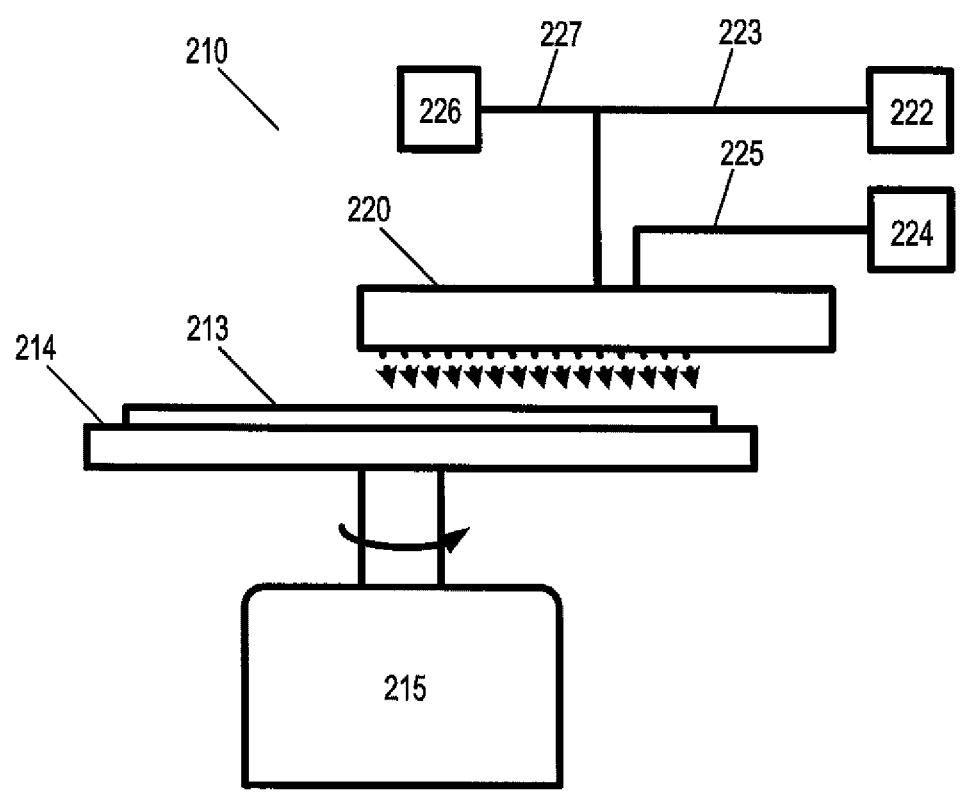
FIG. 9 is a schematic diagram of an apparatus that can carry out an embodiment of the process of the present invention.
Figure 10:
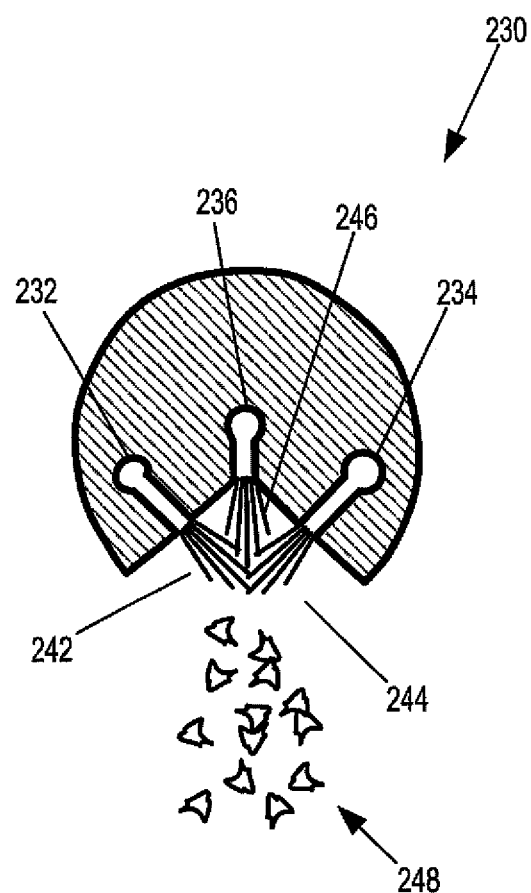
FIG. 10 is a cross sectional view of a spray bar for carrying out an embodiment of the process of the present invention.

In another embodiment, a method of the present invention can be performed with the system shown in FIG. 9, including the spray bar shown in FIG. 10. FIG. 9 shows a modified spray processing system 210 for carrying out the present invention. In system 210, wafer 213, as a particular microelectronic device for example, is supported on a rotatable chuck 214 that is driven by a spin motor 215. This portion of system 210 corresponds to a conventional spray processor device. Spray processors have generally been known, and provide an ability to remove liquids with centrifugal force by spinning or rotating the wafer(s) on a turntable or carousel, either about their own axis or about a common axis. Exemplary spray processor machines suitable for adaptation in accordance with the present invention are described in U.S. Pat. Nos. 6,406,551 and 6,488,272, which are fully incorporated herein by reference in their entireties.

Spray processor type machines are available from TEL FSI, Inc. of Chaska, Minn., e.g., under one or more of the trade designations ORION™ MERCURY™, or ZETA™. Another example of a tool system suitable for adaptation herein is described in U.S. Patent Publication No. 2007/0245954, entitled BARRIER STRUCTURE AND NOZZLE DEVICE FOR USE IN TOOLS USED TO PROCESS MICROELECTRONIC WORKPIECES WITH ONE OR MORE TREATMENT FLUIDS; or as described in U.S. Patent Application Publication No. 2005/0205115, entitled RESIST STRIPPING METHOD AND RESIST STRIPPING APPARATUS or U.S. Patent Application Publication No. 2009/0280235, entitled TOOLS AND METHODS FOR PROCESSING MICROELECTRONIC WORKPIECES USING PROCESS CHAMBER DESIGNS THAT EASILY TRANSITION BETWEEN OPEN AND CLOSED MODES OF OPERATION.

Spray bar 220 comprises a plurality of nozzles to direct liquid onto wafer 213 in the form of a continuous stream or as liquid aerosol droplets. The sulfuric acid solution is provided from liquid supply reservoir 222 through line 223, and the stream of water vapor is similarly provided from supply reservoir 224 though line 225. Hydrogen peroxide is provided from hydrogen peroxide supply reservoir 226 through line 227 to sulfuric acid supply line 223. This configuration permits addition of hydrogen peroxide to the sulfuric acid solution with the benefit that the hydrogen peroxide is not stored and heated in the presence of sulfuric acid, and additionally that the amount of hydrogen peroxide used in the treatment method may be independently controlled from the amount of sulfuric acid as dictated by specific process requirements. Thus, a variable hydrogen peroxide concentration can be applied during a treatment process as desired. Alternatively, the hydrogen peroxide can be supplied to the stream of water vapor at line 225.

Spray bar 220 is preferably provided with a plurality of nozzles to generate aerosol droplets of treatment composition that results from impinging the mixed acid liquid stream with the stream of water vapor. In a preferred embodiment, nozzles are provided at a spacing of about 3.5 mm in spray bar 220 at locations corresponding to either the radius of the wafer or the full diameter of the wafer when spray bar 220 is in position over wafer 213. Nozzles may optionally be provided at different spacing closer to the axis of rotation as compared to the spacing of the nozzles at the outer edge of the wafer. A preferred spray bar configuration is described in U.S. Patent Application Publication No. 2008/0008834, entitled BARRIER STRUCTURE AND NOZZLE DEVICE FOR USE IN TOOLS USED TO PROCESS MICROELECTRONIC WORKPIECES WITH ONE OR MORE TREATMENT FLUIDS.

A cross-sectional view of a spray bar 230 is shown in FIG. 10, illustrating a preferred nozzle configuration of the present invention. For purposes of the present invention, an integrally arranged set of orifices in a body that is directed to provide streams that impinge one another is considered a single nozzle. In the configuration as shown, acid liquid stream orifices 232 and 234 are directed inward to provide impinging streams 242 and 244. Water vapor dispense orifice 236 is located as shown in this embodiment between liquid acid solution orifices 232 and 234, so water vapor stream 246 impinges with liquid acid streams 242 and 244 externally of the nozzle body. As a result of this impingement, atomization occurs, thereby forming liquid aerosol droplets 248.

In addition, the droplets are given enhanced directional momentum toward the surface of the substrate because of the relatively high pressure of the water vapor stream as it exits from water vapor dispense orifice 236. This centrally located orifice in the nozzle assembly thus provides an advantageous directional aspect to assist in removal of material from the surface of the substrate. Alternatively, the positioning of the orifices may be reversed, i.e., the acid liquid stream may be dispensed from orifice 236 and water vapor may be dispensed from orifices 232 and 234.

Optionally, an additional ingredient, such as a gas, may be dispensed from one or more orifices in the nozzle assembly.

The location, direction of the streams, and relative force of the streams are selected to preferably provide a directional flow of the resulting liquid aerosol droplets, so that the droplets are directed to the surface of a substrate to effect the desired treatment.

In one embodiment, the liquid aerosol droplets are caused to contact the surface at an angle that is perpendicular to the surface of the wafer. In another embodiment, the liquid aerosol droplets are caused to contact the surface of the wafer at an angle of from about 10 to less than 90 degrees from the surface of the wafer. In another embodiment, the liquid aerosol droplets are caused to contact the surface of the wafer at an angle of from about 30 to about 60 degrees from the surface of the wafer. In an embodiment, the wafer is spinning at a rate of about 10 to about 1000 rpm during contact of the aerosol droplets with the surface of the wafer. In another embodiment, the wafer is spinning at a rate of about 50 to about 500 rpm.

The direction of the contact of the droplets with the wafer may in one embodiment be aligned with concentric circles about the axis of spin of the wafer, or in another embodiment may be partially or completely oriented away from the axis of rotation of the wafer. System 210 preferably employs suitable control equipment (not shown) to monitor and/or control one or more of fluid flow, fluid pressure, fluid temperature, combinations of these, and the like to obtain the desired process parameters in carrying out the particular process objectives.

It will be appreciated that the various embodiments of the method as described herein (such as variation in delivery of the sulfuric acid composition) are not limited to use with the specific apparatus of the figures, but rather are applicable to use in all configurations of treatment machines appropriate for use in carrying out the presently described methods. Further, optional additional treatments can be performed on a substrate. For example, a treatment sequence may include high temperature SPM according to the present invention—DI Water—SC1 ($NH_4OH:H_2O_2:H_2O$)—DI Water—dry.

The principles of the present invention will now be described in connection with the following illustrative examples.

Examples 1-5 illustrate how exposing a liquid sulfuric acid composition on a substrate surface to water vapor can be used to remove an organic material such as photoresist.

EXPERIMENTAL TECHNIQUES

A. Sample Preparation for Examples 1-5

Wafer samples were prepared for evaluation of effectiveness of removal of ion implanted photoresist as follows:
  200 mm diameter silicon wafers were coated with Shipley UV6 248 nm photo resist.
  Some of the wafers were patterned and others were left with a complete layer of resist (patterned and blanket wafers respectively).
  Samples of both patterned and blanket wafers were implanted with arsenic at an energy of 40 keV, and with a dose of either $5\times10^{14}$ or $1\times10^{15}$ atoms/cm$^2$ (5E14 or 1E15).
  Approximately 2×2 cm fragments of resist coated wafers were cleaved from full patterned and blanket wafers and attached near the center of carrier wafers with high-temperature epoxy. Five resist samples were typically attached to each carrier wafer: blanket resist (no implant), blanket 5E14, patterned 5E14, blanket 1E15, and patterned 1E15.

B. Evaluate Strip Efficiency

After processing, the samples were examined by bright field and darkfield optical microscopy. Table 1 shows the evaluation criteria for both blanket and patterned resist samples. The patterned samples consisted of various lithographic test patterns. Stripping of the arrays of fine lines on the patterned samples and of the blanket film served as measures of the stripping efficiency of a treatment.

TABLE 1

| Score | Explanation, Patterned Resist | Explanation, Blanket Resist |
|---|---|---|
| 1 | Gross lines and some blanket remaining | Only some undercut at edges of sample |
| 2 | Some lines and blanket remaining | Whole surface of resist damaged |
| 3 | Significant fine lines remaining | Some removal of resist |
| 4 | Few fine lines remaining | Small spots of resist remaining |
| 5 | No visible residue (bright or dark field) | No visible residue (bright or dark field) |

C. Chamber Temperature Measurements

The temperature of the liquid composition of sulfuric acid/hydrogen peroxide as cast onto the side wall of the processing chamber was measured by temperature sensor 41. This temperature was recorded at one second intervals and provides a thermal history of the chamber temperature through the process.

D. On-Wafer Temperature Measurements

Measurements of the maximum on-wafer temperature were made by attaching labels to the wafers with dots that changed color irreversibly at specified elevated temperatures (TL-10 series from Omega Engineering, Stamford, Conn.). The labels were covered with a 0.7 mm glass sheet attached with high temperature epoxy for protection from the stripping chemistries.

E. Treatment Process

The wafers prepared in the manner described above were treated in a ZETA® spray processing tool commercially available from TEL FSI, Inc., Chaska, Minn. under the following conditions:

1. The sample wafer was loaded in slot 13 of a 27 wafer carrier cassette 20 and the other slots filled with bare wafers. This cassette and a second balance cassette were loaded onto the turntable 22. A second sample wafer was loaded into slot 15 if needed.
2. The turntable 22 was rotated at 120 rpm and heated $H_2SO_4$ (110° C.) from the recirculation bath 50 was dispensed on the wafers from both the center 36 and side 40 spray posts for 3 minutes at a flow rate of approximately 5 lpm. 50 cc/min of $H_2O_2$ was added to the flow during the last approximately 1 minute of the dispense. This step served to both preheat and wet completely the wafers.
3. The turntable was rotated at 120 rpm and a 900 cc/min flow of a mixture of fresh sulfuric acid composition ($H_2SO_4$ and $H_2O_2$—SPM) from the mixing manifold 90 was dispensed from the center spray post 36 for 30 seconds. The $H_2SO_4$ was preheated to 95° C. by an inline IR Heater before the $H_2O_2$ was added. The blend ratio of the SPM composition varied between treatments as listed in Table 2.
4. The process continued as above in 3. for six minutes except that, in the inventive treatments, approximately 8 lpm of 95° C. DI water 44 was dispensed onto the turn table 22 to generate water vapor.
5. After a six minute rinse with DI water, the samples were treated for 75 seconds with an 80° C. SC-1 solution (1:1:15 vol ratio of $NH_4OH$:$H_2O_2$:$H_2O$).
6. The samples were rinsed in DI water and dried in $N_2$.

TABLE 2

| Example Treatment Protocol | $H_2SO_4$/$H_2O_2$ Blend Ratio | Water Vapor Added | Max on-wafer temperature (° C.) | Max side bowl temperature (° C.) |
|---|---|---|---|---|
| 1 | 20:1 | Yes | 204 | 159 |
| 2 (comparative) | 20:1 | No | 93 | 60 |
| 3 | 10:1 | Yes | 154 | 50 |
| 4 (comparative) | 10:1 | No | 62 | 37 |
| 5 | 5:1 | Yes | 126 | 45 |
| 6 (comparative) | 5:1 | No | 78 | 43 |
| 7 | 2.17:1 | Yes | 145 | 54 |
| 8 (comparative) | 2.17:1 | No | 72 | 32 |

EXAMPLES

Example 1

Figure 4:
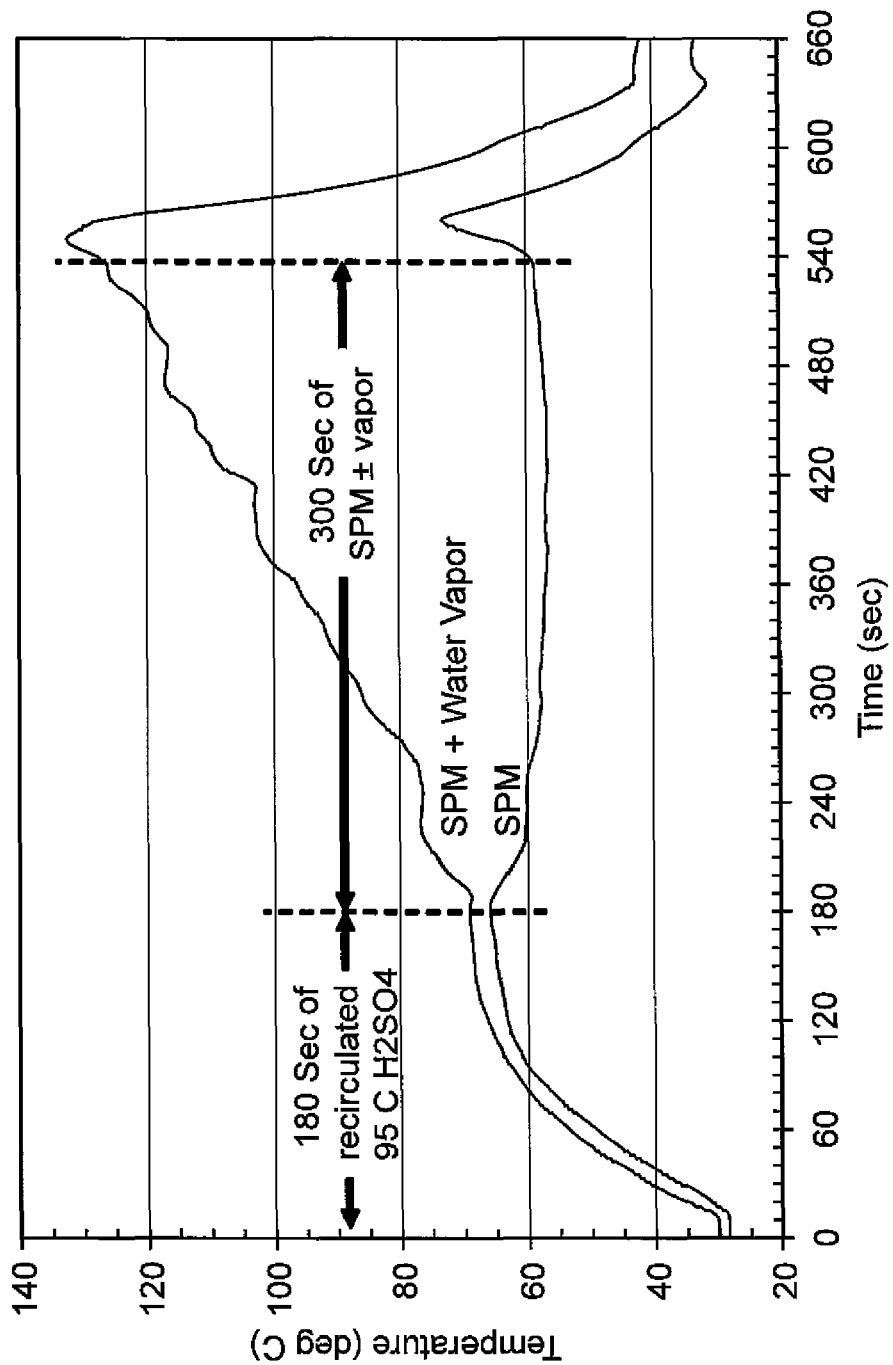
FIG. 4 is graph showing the temperature of the liquid composition of sulfuric acid/hydrogen peroxide as cast onto the side wall of the processing chamber during runs of a comparative process and of a process of the present invention.

Treatment Process E from above was performed twice using a 10:1 blend of SPM with and without the addition of water vapor (Protocols 3 and 4 from Table 2). The temperature of the liquid cast off against the chamber wall was measured by the side bowl temperature sensor 41. FIG. 4 shows the temperature profiles of the two treatments. In both cases, the 5 lpm recirculated flow of $H_2SO_4$ heated the side bowl sensor to approximately 65° C. in the first three minutes of the treatments. From 3 to 9 minutes, the sensor temperature of the "SPM" comparative example dropped approximately 7° C. to near 58° C. In contrast, the "SPM+water vapor" inventive example rose by 60° C. to 125° C. during the same period. The addition of water vapor in the chamber significantly increased the temperature of the cast off liquid.

Example 2

Figure 5:
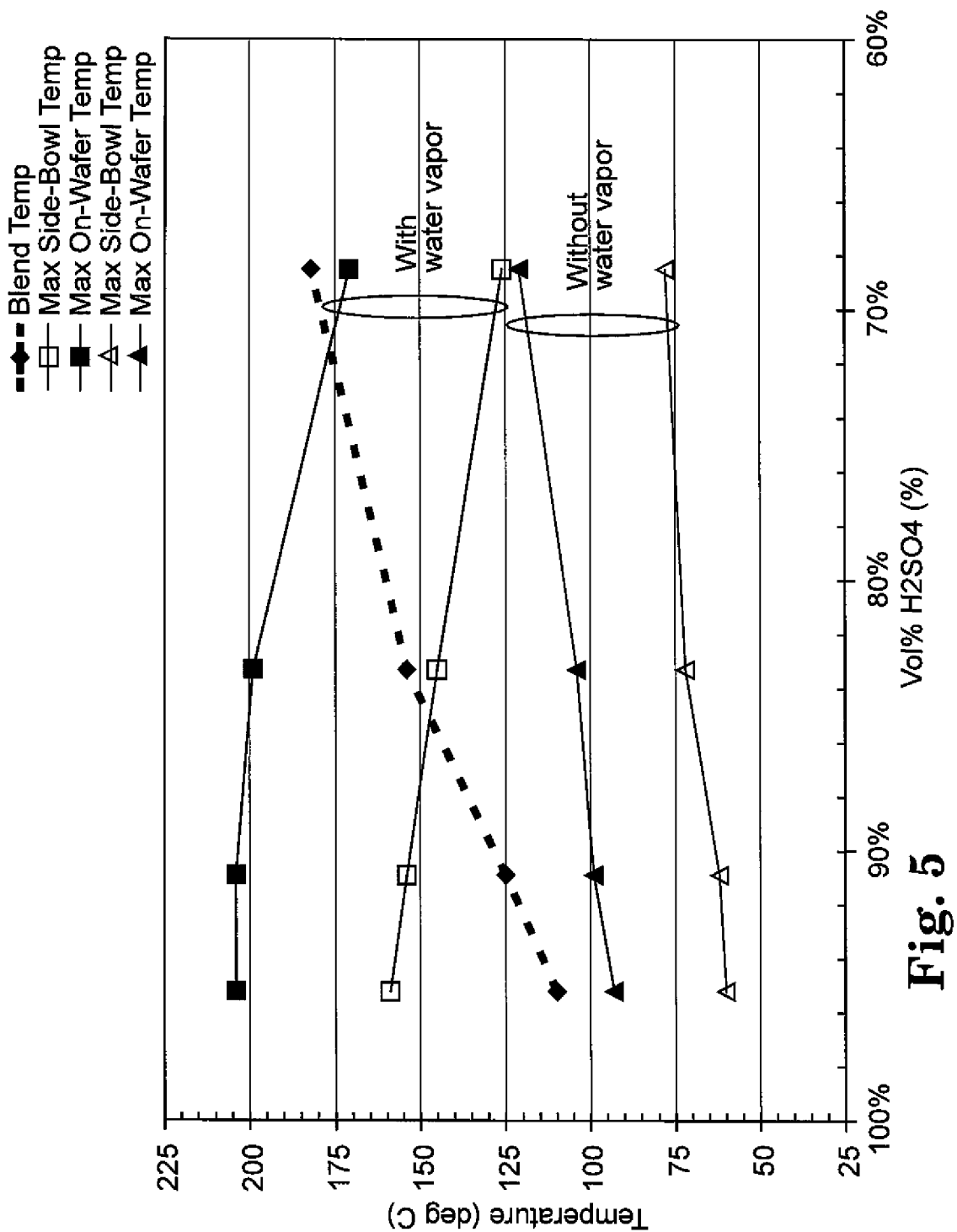
FIG. 5 is a graph showing the maximum measured on-wafer temperatures of the sulfuric acid/hydrogen peroxide composition during runs of a comparative process, and after exposure to water vapor in a process of the present invention. Also shown are the temperatures of the sulfuric acid/hydrogen peroxide compositions as blended, before being dispensed.

Treatment Process E from above was performed 8 times using the 8 Protocols from Table 2. The maximum temperature of the cast off liquid for each treatment was measured with the side bowl temperature sensor 41 at the end of the SPM dispense step (e.g., the 540 sec. reading from FIG. 4). Maximum on-wafer temperatures were measured with temperature sensing labels. FIG. 5 shows the as-blended temperature of the SPM (calculated from FIG. 1) using $H_2SO_4$ preheated to 95° C. by an inline IR Heater, the maximum on-wafer temperature, and the maximum side-bowl temperature for each treatment. The temperature of the as-blended SPM rose with increasing $H_2O_2$ concentration (reduced $H_2SO_4$). The maximum on-wafer and side-bowl temperatures of the comparative examples also rose with increasing $H_2O_2$ concentration, but stayed well below the as-blended temperature of the SPM.

In contrast, the inventive treatments with water vapor achieved on-wafer temperatures 50 to 100° C. higher than the comparative treatments. These inventive temperatures are also substantially higher than either the vapor temperature or the on-wafer SPM temperature in the comparative examples.

(The comparative treatments represent the temperature of the SPM on the substrates prior to vapor exposure.)

Figure 6:
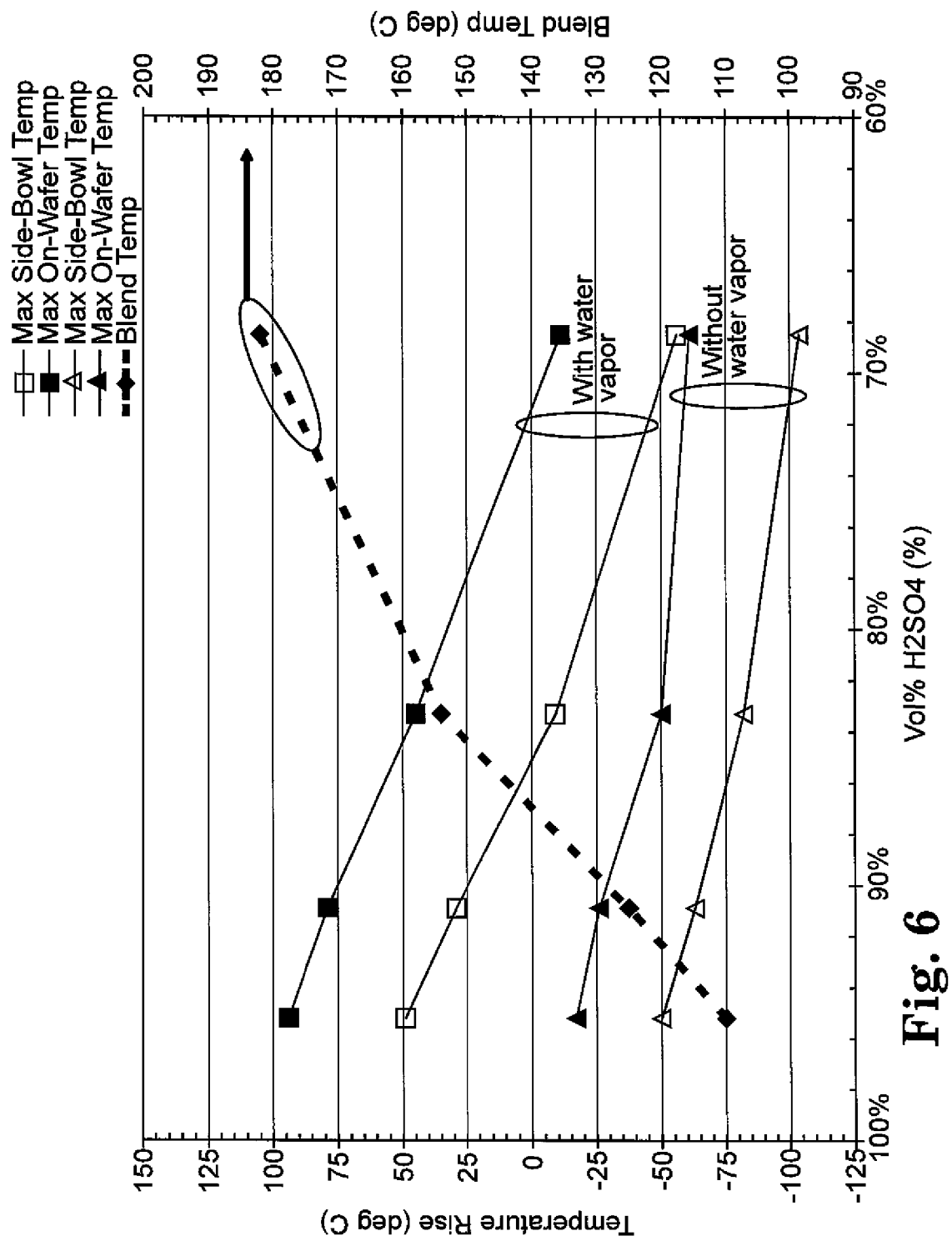
FIG. 6 is a graph showing the difference between the maximum measured on-wafer temperatures of the sulfuric acid/hydrogen peroxide composition after exposure to water vapor and the temperature of the sulfuric acid/hydrogen peroxide compositions as blended during runs of a comparative process, and of a process of the present invention. Also shown are the averaged temperatures of the sulfuric acid/hydrogen peroxide composition as blended, before being dispensed.

Further, the temperature increase between comparative and inventive treatments decreased with increasing $H_2O_2$ concentration. FIG. 6 shows the temperature difference between the as-blended SPM and the maximum on-wafer temperature. The benefit of the inventive vapor process decreases with decreasing $H_2SO_4$ concentrations. To achieve maximum on-wafer temperatures, high concentrations of $H_2SO_4$ are desirable.

It is also desirable to increase the temperature of the as-blended liquid by increasing the pre-blend temperature of the $H_2SO_4$, the $H_2O_2$ or both. One embodiment would utilize $H_2SO_4$ from a recirculation tank operating at greater than 95° C.

Example 3

Treatment Process E from above was performed 8 times using the 8 Protocols from Table 2. Carrier wafers with samples of patterned and blanket, 5E14 and 1E15 implanted resist were processed in slot 13 of the cassette. Table 3 shows the results of evaluating the samples per the guidelines in Table 1. In all cases, the comparative treatments (Protocols 2, 4, 6, and 8) failed to thoroughly remove the implanted resist and scored a "1" in all evaluations. In contrast, the inventive treatments (Protocols 1, 3, 5, and 7) removed completely the patterned and blanket 5E14 resist scoring a "5" in all evaluations.

While performing far better than the comparative treatments, these particular protocols of the inventive process were not able to remove completely the 1E15 implanted resists. Protocols 1, 3, and 5 performed similarly, nearly removing the patterned resist. Protocol 7 performed slightly better on the blanket resist, but far worse on the patterned resist. To achieve maximum strip performance, high concentrations of $H_2SO_4$ are desirable.

TABLE 3

| Example treatment protocol | 5E14 ion implant on patterned resist | 5E14 ion implant on blanket resist | 1E15 ion implant on pattern resist | 1E15 ion implant on blanket resist |
| --- | --- | --- | --- | --- |
| 1 | 5 | 5 | 4 | 2 |
| 2 (comparative) | 1 | 1 | 1 | 1 |
| 3 | 5 | 5 | 4 | 2 |
| 4 (comparative) | 1 | 1 | 1 | 1 |
| 5 | 5 | 5 | 4 | 2 |
| 6 (comparative) | 1 | 1 | 1 | 1 |
| 7 | 5 | 5 | 1 | 3 |
| 8 (comparative) | 1 | 1 | 1 | 1 |

Example 4

A modified version of Treatment Process E from above was performed on 1E15 blanket and patterned wafer samples. The process was as follows:

A 5 lpm flow of $H_2SO_4$ from the recirculation tank was dispensed from the center and side spray posts in 4 segments: 45 sec. at 20 rpm clockwise turntable rotation, 45 sec. at 300 rpm clockwise, 45 sec. at 20 rpm counterclockwise, and 45 sec. at 300 rpm counterclockwise.

A 1600 cc/m flow of 10:1 SPM (1500 of 110° C. $H_2SO_4$ from the recirulation tank and 150 cc/m of fresh 20° C. $H_2O_2$) was dispensed from the center and side spray posts in two segments: 120 sec. at 120 rpm clockwise, 120 sec. at 120 rpm counterclockwise. 8 lpm of 95° C. water was dispensed on the turntable to create water vapor.

A 1000 cc/m flow of fresh 9:1 SPM (900 of 95° C. $H_2SO_4$ and 100 of 20° C. $H_2O_2$) was dispensed from the center spray post in two segments: 180 sec. at 120 rpm clockwise, 180 sec. at 120 rpm counterclockwise. 8 lpm of 95° C. water was dispensed on the turntable to create water vapor.

The combination of increased chemical exposure time, increased temperature, and the reversing of rotation resulted in complete removal of the patterned and blanket 1E15 implanted resist (all scores of "5").

Example 5

In some cases, no oxidant need be added to the sulfuric acid composition as unimplanted or lightly implanted resist can often be removed by $H_2SO_4$ alone. As an example, a 5 lpm flow of 95° C. $H_2SO_4$ from the recirculation tank was dispensed from the center and side spray posts for 3 minutes at 120 rpm. This treatment removed completely unimplanted blanket resist.

Example 6

Example 6 illustrates how exposing a liquid sulfuric acid composition on a substrate surface to water vapor can be used to remove a carbon material such as amorphous carbon.

An FSI Orion® Single Wafer Cleaning System Experiment (commercially available from TEL FSI, Inc, Chaska, Minn.) was used to evaluate the removal of amorphous carbon (a-C) using a high temperature SPM treatment according to the present invention.

Five wafers were used to evaluate the removal of a-C film. The thickness of the a-C film was 7000 angstrom.

Five different processes were run for evaluation under the conditions shown in Table 4. The conditions further included SPM exposure time of 60 seconds and a post-SPM rinse for 30 seconds using SC1 cleaning solution (1:4:50 solution of $NH_4OH:H_2O_2:H_2O$) at 70° C. The $H_2SO_4:H_2O_2$ ratio of was 16:1 for splits 1 and 3, and 16:1 for splits 2 and 4-5. The $H_2SO_4$ temperature before blending with $H_2O_2$ and adding steam was 180° C. for splits 1-2 and 220° C. for splits 3-5. The $H_2O_2$ was at about room temperature before it was blended with the $H_2SO_4$. The SPM and steam were exposed to the a-C film at the same time. The steam pressure set point in the steam generation system was set at 28 psi or 25 psi. The "Normalized SiN Loss to Split #5" refers to SiN material loss measured with blanket SiN wafers.

Results:

The results are shown in Table 4. Visual inspection of the 5 substrates showed that 2 processes (splits 1-2) removed the a-C film from the substrate and 3 processes (splits 3-5) did not fully remove the a-C film and left residue on the substrates. These results show that $H_2SO_4$ preheated to a temperature of 220° C. in splits 3-5 was not able to fully remove the a-C film but, surprisingly, the $H_2SO_4$ preheated to a lower temperature of 180° C. in splits 1-2 was very effective in selectively removing the a-C film while the SiN film was etched at a slower rate.

TABLE 4

| Split # | SPM | Steam | | Normalized SiN Loss to Split #5 | Visual Inspection |
|---|---|---|---|---|---|
| 1 | 16:1 | 180 C. | 28 psi | 0.52 | Clear |
| 2 | 10:1 | 180 C. | 28 psi | 0.63 | Clear |
| 3 | 16:1 | 220 C. | 28 psi | 0.80 | Film across entire wafer |
| 4 | 10:1 | 220 C. | 28 psi | 1.00 | Film on edge of wafer |
| 5 | 10:1 | 220 C. | 25 psi | 1.00 | Film on edge of wafer |

All percentages and ratios used herein are volume percentages and volume ratios unless otherwise indicated. All temperatures recited are assuming an ambient pressure of one atmosphere. It will be understood that if the treatment process is carried out at a different pressure, the temperatures of the various components involved in the process can be adjusted accordingly. All publications, patents and patent documents cited are fully incorporated by reference herein, as though individually incorporated by reference. Numerous characteristics and advantages of the invention meant to be described by this document have been set forth in the foregoing description. It is to be understood, however, that while particular forms or embodiments of the invention have been illustrated, various modifications, including modifications to shape, and arrangement of parts, and the like, can be made without departing from the spirit and scope of the invention.

What is claimed is:

1. A method of removing carbon material from a semiconductor substrate, comprising:
    providing a semiconductor substrate in a treatment chamber, wherein the semiconductor substrate has a carbon film on at least a portion of a surface thereof, wherein the carbon film comprises a material selected from the group consisting of amorphous carbon, diamond-like carbon, and graphitic carbon;
    dispensing a liquid sulfuric acid composition from a first supply line comprising sulfuric acid and/or its desiccating species and precursors onto the substrate surface in an amount effective to substantially uniformly coat the substrate surface; and
    exposing the liquid sulfuric acid composition on the substrate surface to water vapor which is dispensed from a second supply line and in an amount effective to increase the temperature of the liquid sulfuric acid composition above the temperature of the liquid sulfuric acid composition prior to exposure to the water vapor, wherein the liquid sulfuric acid composition is at a temperature of at least 130° C. and less than 220° C. prior to exposure to the water vapor; and
    wherein the liquid sulfuric acid composition on the substrate surface is exposed to the water vapor for a time period to remove at least a portion of the carbon film from the surface.

2. The method of claim 1, wherein an oxidizing agent is added to the liquid sulfuric acid composition prior to exposing the liquid sulfuric acid composition on the substrate surface to the water vapor.

3. The method of claim 2, wherein the oxidizing agent comprises hydrogen peroxide.

4. The method of claim 3, wherein the volumetric ratio of the liquid sulfuric acid composition to the hydrogen peroxide is in a range from 5:1 to 20:1.

5. The method of claim 3, wherein the liquid sulfuric acid composition is at a temperature of at least 130° C. and less than 220° C. before the hydrogen peroxide is added to the liquid sulfuric acid composition.

6. The method of claim 1, wherein the carbon film is provided with a thickness of at least 100 angstroms.

7. The method of claim 1, wherein the carbon film is provided with a first thickness of at least 5000 angstroms and the liquid sulfuric acid composition on the substrate surface is exposed to the water vapor for two minutes or less to remove substantially all of the carbon film.

8. The method of claim 1, wherein providing the semiconductor substrate comprises:
    depositing a carbon film on the semiconductor substrate; and
    subjecting the semiconductor substrate to at least one treatment in the presence of the carbon film.

9. The method of claim 8, wherein the subjecting comprises:
    patterning the carbon film; and
    etching features of the substrate using the patterned carbon film as a mask.

10. The method of claim 1, wherein the substrate is rotating during at least a portion of the dispense of the liquid sulfuric acid composition onto the surface of the substrate.

11. The method of claim 1, wherein the water vapor is generated outside of the treatment chamber and introduced into the treatment chamber in a desired water vapor form.

12. The method of claim 11, wherein the water vapor is at a temperature greater than 85° C. prior to exposure to the liquid sulfuric acid composition.

13. The method of claim 11, wherein the water vapor is at a temperature greater than 120° C. prior to exposure to the liquid sulfuric acid composition.

14. The method of claim 1, wherein the liquid sulfuric acid composition is exposed to the water vapor in an amount effective to increase the temperature of the liquid sulfuric acid composition on the substrate surface above both (i) the temperature of the liquid sulfuric acid composition prior to exposure to the water vapor and (ii) the temperature of the water vapor.

15. The method of claim 1, wherein the carbon film comprises amorphous carbon.

16. The method of claim 1, wherein the carbon film comprises undoped carbon film.

17. The method of claim 1, wherein the carbon film contains at least one dopant.

18. The method of claim 17, wherein the dopant comprises B, P, As, Sb, Si, Ge, Ti, Ta, or Al, or a combination of two or more thereof.

19. The method of claim 1, wherein the carbon film is a hard mask or a patterned hard mask.

20. The method of claim 1, wherein the liquid sulfuric acid composition is dispensed onto the substrate for 2 minutes or less.

21. The method of claim 1, wherein the liquid sulfuric acid composition is dispensed onto the substrate for 1 minute or less.

22. The method of claim 1, wherein the liquid sulfuric acid composition is at a temperature between 160° C. and 200° C. prior to exposure to the water vapor.

23. The method of claim 1, wherein the liquid sulfuric acid composition is at a temperature between 160° C. and 180° C. prior to exposure to the water vapor.

24. The method of claim 1, wherein the liquid sulfuric acid composition is at a temperature between 200° C. and less than 220° C. prior to exposure to the water vapor.

25. The method of claim 1, wherein the semiconductor substrate comprises silicon nitride and/or silicon dioxide.

26. A method of removing carbon material from a semiconductor substrate, comprising:
providing a semiconductor substrate in a treatment chamber, wherein the semiconductor substrate comprises silicon nitride and/or silicon dioxide and has a carbon film on at least a portion of a surface thereof, wherein the carbon film comprises a material selected from the group consisting of amorphous carbon, diamond-like carbon, and graphitic carbon;
dispensing a liquid sulfuric acid composition from a first supply line comprising sulfuric acid and/or its desiccating species and precursors onto the substrate surface in an amount effective to substantially uniformly coat the substrate surface; and
exposing the liquid sulfuric acid composition on the substrate surface to water vapor which is dispensed from a second supply line and in an amount effective to increase the temperature of the liquid sulfuric acid composition above the temperature of the liquid sulfuric acid composition prior to exposure to the water vapor, wherein the liquid sulfuric acid composition on the substrate surface is exposed to the water vapor for a time period to remove at least a portion of the carbon film from the surface while less than 8 angstroms per minute of the silicon nitride and/or silicon dioxide is removed from the substrate.

27. The method of claim 26, wherein hydrogen peroxide is added to the liquid sulfuric acid composition prior to exposing the liquid sulfuric acid composition on the substrate surface to the water vapor.

28. The method of claim 26, wherein the liquid sulfuric acid composition is at a temperature of at least 130° C. and less than 220° C. prior to exposure to the water vapor.

29. The method of claim 26, wherein the liquid sulfuric acid composition is at a temperature of at least 130° C. prior to exposure to the water vapor.

* * * * *